US012310017B2

(12) United States Patent
Kitamura et al.

(10) Patent No.: US 12,310,017 B2
(45) Date of Patent: May 20, 2025

(54) SEMICONDUCTOR DEVICE AND METHOD FOR MANUFACTURING SEMICONDUCTOR DEVICE

(71) Applicant: Kioxia Corporation, Tokyo (JP)

(72) Inventors: Masayuki Kitamura, Yokkaichi Mie (JP); Takuya Hirohashi, Ebina Kanagawa (JP); Shigeru Kinoshita, Yokohama Kanagawa (JP); Hiroshi Toyota, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 600 days.

(21) Appl. No.: 17/466,200

(22) Filed: Sep. 3, 2021

(65) Prior Publication Data

US 2022/0085053 A1 Mar. 17, 2022

(30) Foreign Application Priority Data

Sep. 15, 2020 (JP) ................................ 2020-154872

(51) Int. Cl.
*H10B 43/20* (2023.01)
*G11C 16/14* (2006.01)
*H10B 43/10* (2023.01)

(52) U.S. Cl.
CPC ............. *H10B 43/20* (2023.02); *G11C 16/14* (2013.01); *H10B 43/10* (2023.02)

(58) Field of Classification Search
CPC ........ H10B 43/20; H10B 43/10; H10B 43/27; H10B 41/27; H10B 43/35; H10B 43/50; G11C 16/14; G11C 16/0483
See application file for complete search history.

(56) References Cited

U.S. PATENT DOCUMENTS

| | | | |
|---|---|---|---|
| 10,043,808 B1 | 8/2018 | Tezuka et al. | |
| 10,727,276 B1* | 7/2020 | Lien | H10N 70/24 |
| 10,910,401 B2* | 2/2021 | Sawa | H10B 41/10 |
| 2010/0270529 A1 | 10/2010 | Lung | |
| 2019/0067094 A1 | 2/2019 | Zope et al. | |
| 2019/0326314 A1 | 10/2019 | Xiao et al. | |
| 2019/0348423 A1 | 11/2019 | Kim | |
| 2020/0091160 A1 | 3/2020 | Ino et al. | |
| 2020/0098787 A1* | 3/2020 | Kaneko | H10B 41/27 |
| 2020/0258896 A1 | 8/2020 | Baraskar et al. | |
| 2020/0287007 A1* | 9/2020 | Kasai | H01L 29/4234 |
| 2020/0295026 A1* | 9/2020 | Oike | H01L 21/76831 |

(Continued)

FOREIGN PATENT DOCUMENTS

| | | |
|---|---|---|
| TW | 200618194 A | 6/2006 |
| TW | 201039476 A | 11/2010 |

(Continued)

*Primary Examiner* — Khaja Ahmad
*Assistant Examiner* — Khatib A Rahman
(74) *Attorney, Agent, or Firm* — Foley & Lardner LLP

(57) ABSTRACT

According to one embodiment, a semiconductor device includes: a stacked body including an insulating layer, and a conductive layer containing molybdenum; an aluminum oxide layer provided between the insulating layer and the conductive layer; and a protective layer in contact with the aluminum oxide layer, containing one of carbon, nitrogen, or sulfur bonded to aluminum in the aluminum oxide layer, and also in contact with the conductive layer.

8 Claims, 25 Drawing Sheets

(56) References Cited

U.S. PATENT DOCUMENTS

2021/0118906 A1* 4/2021 Sawa .................... H10B 41/27
2022/0238453 A1* 7/2022 Sharangpani .......... H10B 43/50

FOREIGN PATENT DOCUMENTS

| TW | 201715705 A | 5/2017 |
| TW | 201836072 A | 10/2018 |
| TW | 201944542 A | 11/2019 |
| TW | 202013681 A | 4/2020 |

* cited by examiner

FIG. 13

| BASE | MoO₂Cl₂ ADSORPTION | H₂ ADSORPTION | H₂O DESORPTION | HCl DESORPTION |
|---|---|---|---|---|
| Mo(110) SURFACE | −5.06 | −1.50 | 3.22 | 2.76 |
| r-Al₂O₃(110) SURFACE | −3.91 | −2.04 | 3.77 | 4.38 |
| TiN(110) SURFACE | −3.46 | −0.24 | 0.95 | 2.20 |

*FIG. 15*

| TYPES OF GASES | XClHn DESORPTION |
|---|---|
| $CH_4$ ($C_xH_y$) (GAS CONTAINING CARBON, X=C) | 0.11 ($CClH_3$ DESORPTION, X=C) |
| $NH_3$ (GAS CONTAINING NITROGEN, X=N) | 1.60 ($NClH_2$ DESORPTION, X=C) |
| $H_2S$ (GAS CONTAINING SULFUR, X=S) | 3.49 ($SClH$ DESORPTION, X=S) |

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2020-154872, filed on Sep. 15, 2020, the entire contents of which are incorporated herein by reference.

FIELD

Embodiments described herein relate generally to a semiconductor device and a method for manufacturing the semiconductor device.

BACKGROUND

A three-dimensional memory device having a plurality of memory cells arranged three dimensionally has been proposed. The three-dimensional memory device has a stacked body in which insulating films and conductive films are alternately stacked, and a columnar semiconductor layer provided in a stacking direction of the stacked body. The memory cells are provided between the conductive films of the stacked body and the columnar semiconductor layer.

DESCRIPTION OF THE DRAWINGS

FIG. 13 is a diagram illustrating a first-principle calculation result of adsorption energy of a gas adsorbed on the surface of each material and desorption energy of a gas desorbed from the surface of each material.

FIG. 15 is a diagram illustrating a first-principle calculation result of desorption energy of a gas desorbed from an insulating layer.

DETAILED DESCRIPTION

Figure 1:
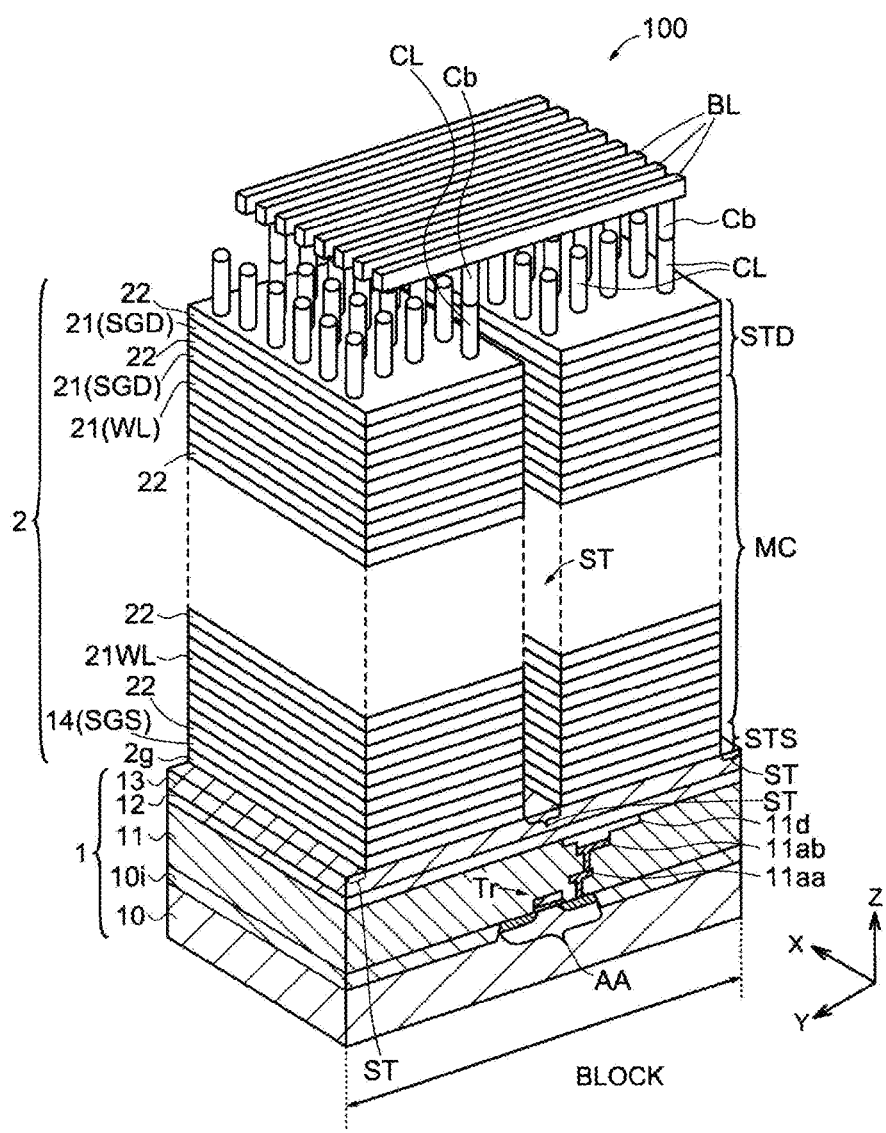
FIG. 1 is a perspective view illustrating a semiconductor device according to an embodiment.

Embodiments provide a semiconductor device and a method for manufacturing the semiconductor device which are capable of improving the reliability and productivity of the semiconductor device.

In general, according to one embodiment, a semiconductor device includes: a stacked body including: an insulating layer, and a conductive layer containing molybdenum; an aluminum oxide layer provided between the insulating layer and the conductive layer; and a protective layer in contact with the aluminum oxide layer, containing one of carbon, nitrogen, or sulfur bonded to aluminum in the aluminum oxide layer, and also in contact with the conductive layer.

According to one embodiment, a method for manufacturing a semiconductor device, includes: forming an insulating layer on a substrate; forming an aluminum oxide layer on the insulating layer; supplying a first gas containing one of carbon, nitrogen, and sulfur to the aluminum oxide layer; after supplying the first gas, further supplying a material gas containing molybdenum and a reducing gas for reducing the material gas; and forming a conductive layer containing the molybdenum.

Hereinafter, a semiconductor device and a method for manufacturing the semiconductor device according to an embodiment will be described in detail with reference to the drawings. In the following description, elements having substantially the same function and configuration are denoted by the same reference numerals, or reference numerals in which alphabets are added after the same reference numerals (reference numerals in which a, b, A, B, etc. are added after the numbers), and therefore, detailed explanation thereof may be omitted as appropriate. In addition, the letters "first" and "second" added for each element are convenient signs used to distinguish one element from another, and have no more meaning unless otherwise specified. Each of the following embodiments exemplifies an apparatus or method for embodying the technical idea of the embodiment, and does not limit the material, shape, structure, arrangement, etc. of the elements to those which will be described later. The technical ideas of the embodiments include various modifications added to those described in the claims.

Further, the vertical direction of the semiconductor device according to the present embodiment indicates a relative direction when a surface on which a memory cell is provided is facing up with respect to a substrate. In this way, for convenience of explanation, the terms "upper" and "lower" will be used. It is noted that, for example, the vertical relationship between the substrate and the memory cell may be arranged in the opposite directions to those illustrated in the drawings. Further, in the following description, for example, the description of a memory cell on a substrate merely explains the vertical relationship between the substrate and the memory cell as described above, and another member may be arranged between the substrate and the memory cell.

Each of the following embodiments illustrates an example of application to a nonvolatile memory including a plurality of memory cells as a semiconductor device. The techniques of the present disclosure maybe applied to a semiconductor device (e.g., a CPU, a display, an interposer, etc.) other than the nonvolatile memory.

[Overall Configuration of Semiconductor Device 100]

Figure 2:
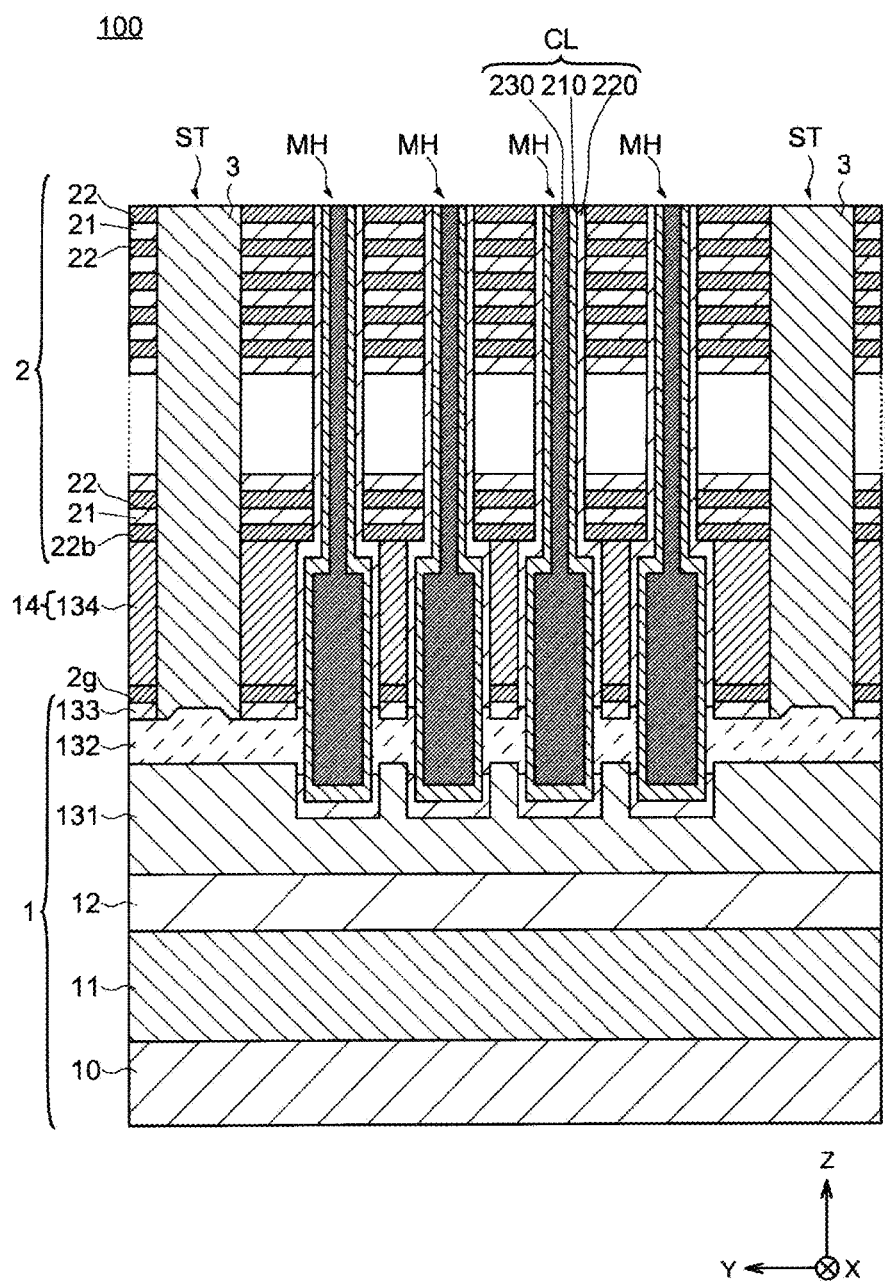
FIG. 2 is a cross-sectional view illustrating the semiconductor device according to the embodiment.
Figure 3:
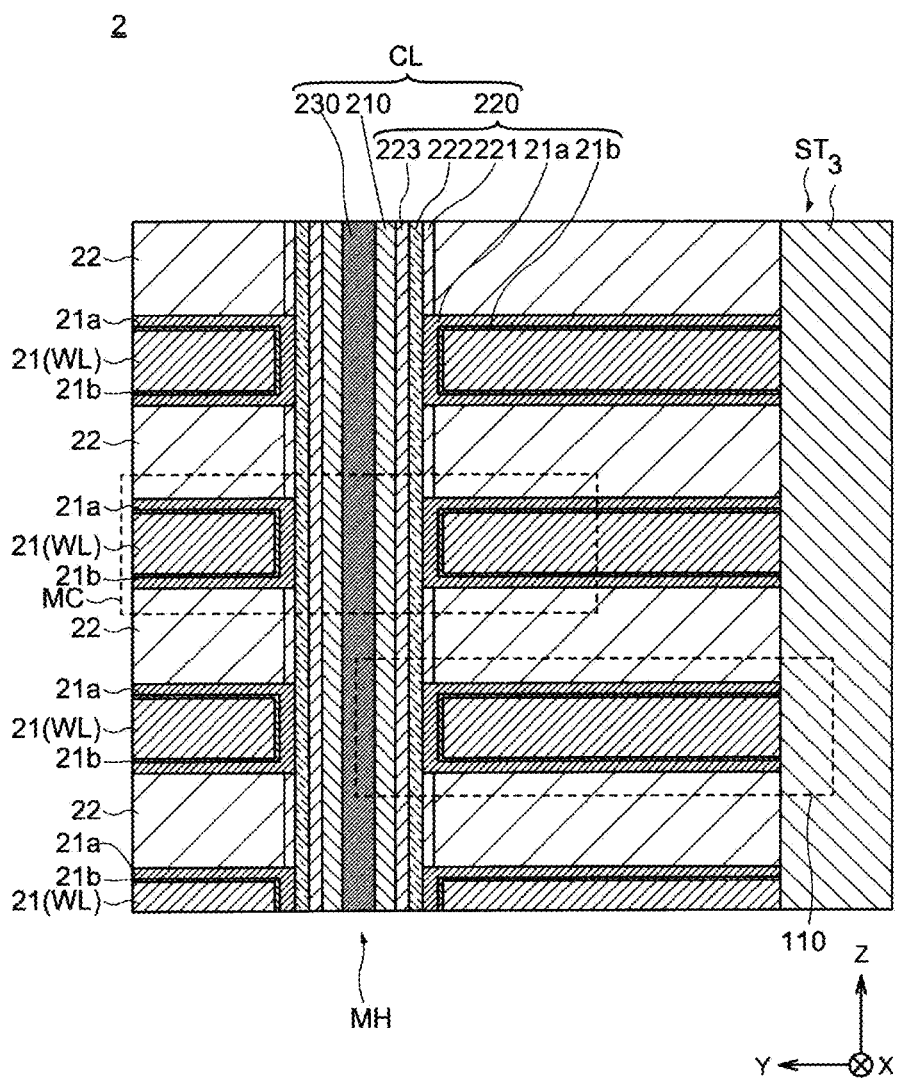
FIG. 3 is a cross-sectional view illustrating a semiconductor device according to an embodiment.
Figure 4:
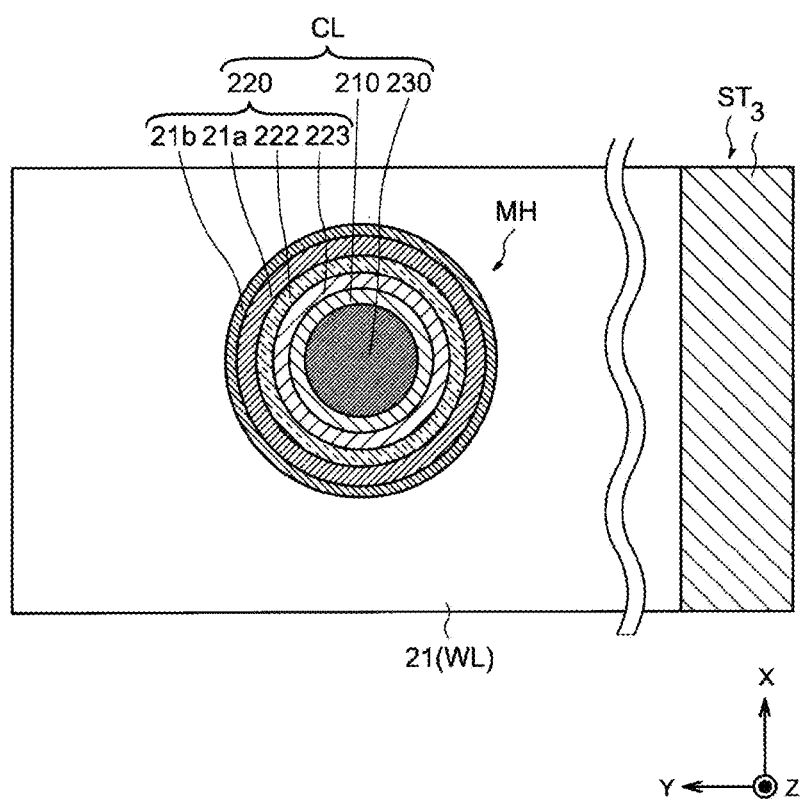
FIG. 4 is a cross-sectional view illustrating a semiconductor device according to an embodiment.
Figure 5:
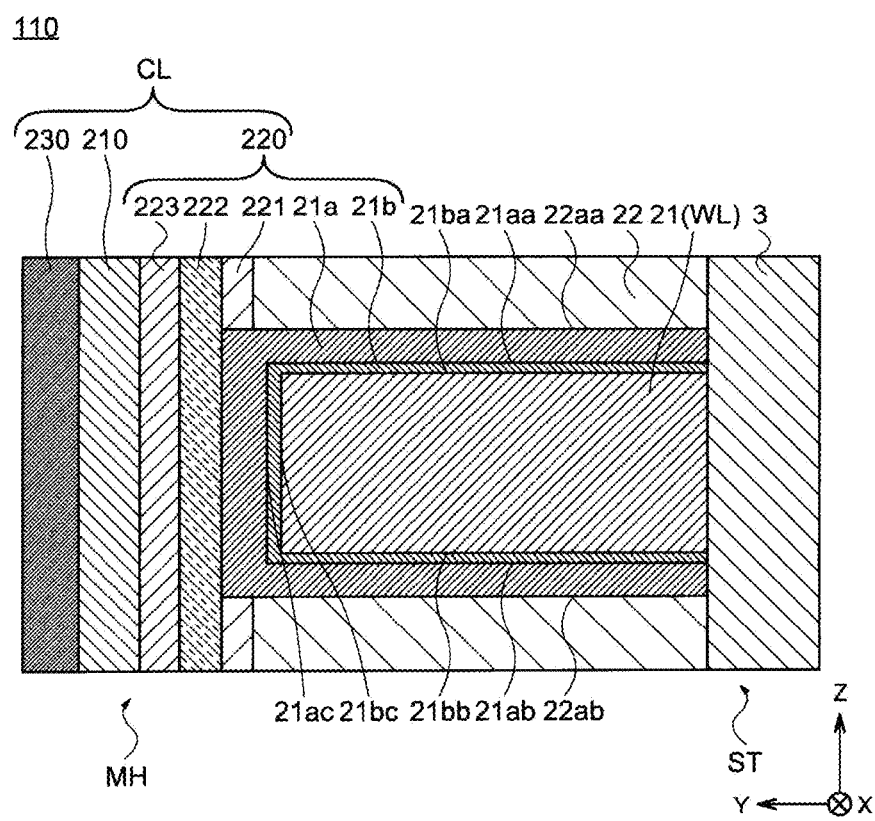
FIG. 5 is a cross-sectional view illustrating a semiconductor device according to an embodiment.

The overall configuration of a semiconductor device 100 according to an embodiment will be described with reference to FIGS. 1 to 5. FIG. 1 is a perspective view illustrating a semiconductor device 100 according to an embodiment. FIG. 2 is a cross-sectional view illustrating a cross section of the semiconductor device 100 illustrated in FIG. 1 along the Y direction and the Z direction. FIG. 3 is a cross-sectional view illustrating an enlarged cross section of a stacked body 2 in the semiconductor device 100 illustrated in FIG. 2. FIG. 4 is a cross-sectional view illustrating a cross section of a memory hole MH in the semiconductor device 100 illustrated in FIG. 2 along the X direction and the Y direction. FIG. 5 is a cross-sectional view illustrating an enlarged cross section of an area 110 illustrated in FIG. 3. In the present embodiment, it is assumed that the stacking direction of the stacked body 2 is the Z direction, the direction orthogonal to the Z direction is the Y direction, and the direction orthogonal to the Z direction and the Y direction is the X direction. The configuration of the semiconductor device 100 according to the present embodiment is not limited to the configuration illustrated in FIGS. 1 to 5.

As illustrated in FIG. 1, the semiconductor device 100 is a nonvolatile memory having a three-dimensional memory device having a plurality of memory cells MC (FIG. 3) arranged three dimensionally. For example, the nonvolatile memory is an NAND flash memory.

The semiconductor device 100 includes a base portion 1, a stacked body 2, and a plurality of columnar portions CL.

The base portion 1 includes a substrate 10, an insulating layer 11, a conductive layer 12, and a semiconductor portion 13. The insulating layer 11, the conductive layer 12, and the semiconductor portion 13 are provided above the substrate 10 in this order.

The substrate 10 is a semiconductor substrate, for example, a silicon substrate. The surface area of the substrate 10 includes, for example, an element isolation area 10i and an active area AA. The element isolation area 10i is, for example, an insulating area including silicon oxide. The active area AA includes a source/drain area of a transistor Tr. The element isolation area 10i insulates a plurality of active areas AA from each other.

The insulating layer 11 is provided on the substrate 10 in contact with the substrate 10. The insulating layer 11 includes, for example, a gate electrode of the transistor Tr and a gate insulating layer. The insulating layer 11 is an interlayer insulating layer and insulates a plurality of transistors Tr from each other. In the insulating layer 11, for example, a wiring 11aa, a wiring 11ab, and an insulating layer 11d are stacked in this order from below (the side where the substrate 10 is provided) to above (the side where the conductive layer 12 is provided) with respect to the insulating layer 11. That is, the insulating layer 11 includes a multilayer wiring structure in which insulating layers and wiring layers are alternately stacked. FIG. 2 illustrates a multilayer wiring structure including two wiring layers and three insulating layers. However, the multilayer wiring structure is not limited to the example illustrated in FIG. 2, but may be a structure in which the number of layers in a range that do not depart from the gist of the present embodiment are stacked. The wiring 11aa is a wiring electrically connected to the transistor Tr. The wiring 11ab is a wiring electrically connected to the wiring 11aa.

The conductive layer 12 is provided on the insulating layer 11 in contact with the insulating layer 11. The semiconductor portion 13 is provided on the conductive layer 12 in contact with the conductive layer 12. The plurality of transistors Tr form a peripheral circuit of the nonvolatile memory.

The stacked body 2 is provided above the substrate 10 and is located in the Z direction with respect to the semiconductor portion 13. In the stacked body 2, a plurality of conductive layers 21 and a plurality of insulating layers 22 are alternately stacked in the Z direction. The Z direction is a stacking direction of the stacked body 2. The insulating layer 22 electrically insulates between the plurality of conductive layers 21 adjacent to each other in the Z direction. The number of stacked layers of the conductive layer 21 and the insulating layer 22 maybe freely selected. The insulating layer 22 may be, for example, a space (gap). For example, an insulating layer 2g is provided between the stacked body 2 and the semiconductor portion 13.

The conductive layer 21 constitutes at least one source-side select gate SGS, a plurality of word lines WL, and at least one drain-side select gate SGD. The source-side select gate SGS is a gate electrode of a source-side select transistor STS. The word line WL is a gate electrode of a memory cell MC. The drain-side select gate SGD is a gate electrode of a drain-side select transistor STD. The source-side select gate SGS is provided in the lower area of the stacked body 2 (an area on the side where the semiconductor portion 13 is provided with respect to the stacked body 2). The drain-side select gate SGD is provided in the upper area of the stacked body 2 (an area opposite to the side where the semiconductor portion 13 is provided with respect to the stacked body 2). The word line WL is provided between the source-side select gate SGS and the drain-side select gate SGD. In the present embodiment, for example, the gate electrode of the memory cell MC and the word line WL function as a control gate.

The stacked body 2 further includes a semiconductor portion 14. The semiconductor portion 14 is located between the stacked body 2 and the semiconductor portion 13. The semiconductor portion 14 is provided between the insulating layer 22, which is closest to the semiconductor portion 13, and the insulating layer 2g. The semiconductor portion 14 functions as, for example, the source-side select gate SGS.

The semiconductor device 100 has a plurality of memory cells MC connected in series between the source-side select transistor STS and the drain-side select transistor STD. A structure in which the source-side select transistor STS, the plurality of memory cells MC, and the drain-side select transistor STD are connected in series is called a memory string or an NAND string. The memory string is connected to a bit line BL via, for example, a contact Cb. The bit wire BL is provided above the stacked body 2 (the direction opposite to the side where the semiconductor portion 13 is provided with respect to the stacked body 2) and extends in the Y direction.

The cross-sectional structure of the semiconductor device 100 will be described with reference to FIGS. 2 to 5. In the description of the cross-sectional structure of the semiconductor device 100 with reference to FIGS. 2 to 4, points different from those in FIG. 1 will be mainly described, and the description of the configuration that is the same as or similar to that in FIG. 1 may be omitted.

As illustrated in FIG. 2, the semiconductor device 100 includes a semiconductor layer 131, a semiconductor layer 132, and a semiconductor layer 133. The semiconductor portion 13 (FIG. 1) includes the semiconductor layer 131, the semiconductor layer 132, and the semiconductor layer 133. The semiconductor layer 131 is provided on the conductive layer 12 in contact with the conductive layer 12. The semiconductor layer 132 is provided on the semiconductor layer 131 in contact with the semiconductor layer 131. The semiconductor layer 133 is provided on the semiconductor layer 132 in contact with the semiconductor layer 132. In FIG. 2, the element isolation area 10i, the active area AA, the transistor Tr, the wiring 11aa, the wiring 11ab, and the insulating layer 11d illustrated in FIG. 1 are omitted.

The stacked body 2, the memory hole MH, and a slit ST in the semiconductor device 100 will be described in more detail with reference to FIGS. 2 to 5.

As illustrated in FIGS. 2 to 5, each of the plurality of columnar portions CL is provided inside the memory hole MH. The memory hole MH is provided in the Z direction so as to penetrate the stacked body 2 from the upper end of the stacked body 2. A semiconductor body 210, a memory film 220, and a core layer 230 are provided inside the memory hole MH. The semiconductor body 210, the memory film 220, and the core layer 230 extend in the Z direction along the memory hole MH. The semiconductor body 210 as a semiconductor column (semiconductor layer) is electrically connected to the semiconductor portion 13. The plurality of columnar portions CL arranged in the Y direction are connected in common to one bit line BL (FIG. 1) via the contact Cb (FIG. 1). The shape of the memory hole MH in the X-Y plane (FIG. 4) is, for example, circular or elliptical.

A block insulating layer 21a, which forms a portion of the memory film 220, and a protective layer 21b are provided between the conductive layer 21 and the insulating layer 22. The block insulating layer 21a is provided between the conductive layer 21 and the semiconductor body 210 and between the conductive layer 21 and the insulating layer 22.

The block insulating layer 21a is provided around the conductive layer 21 and is provided between the conductive layer 21 and the semiconductor body 210 and between the conductive layer 21 and the insulating layer 22.

The protective layer 21b is provided around the block insulating layer 21a so as to be in contact with the block insulating layer 21a, and is provided between the conductive layer 21 and the semiconductor body 210 and between the conductive layer 21 and the insulating layer 22.

The shape of the semiconductor body 210 is, for example, a tubular shape. The semiconductor body 210 functions as a channel area of each of the drain-side select transistor STD, the memory cell MC, and the source-side select transistor STS.

The memory film 220 includes the block insulating layer 21a, the protective layer 21b, a cover insulating layer 221, a charge trapping layer 222, and a tunnel insulating layer 223. The memory film 220 is provided in a tubular shape so as to extend in the Z direction along the inner wall of the memory hole MH. Further, the memory film 220 is provided between the semiconductor body 210 and the conductive layer 21 or the insulating layer 22. The plurality of memory cells MC have the memory film 220 between the semiconductor body 210 and the conductive layer 21 as a storage area. The plurality of memory cells MC are arranged in the Z direction. The conductive layer 21 may be a word line WL, or may be a wiring electrically connected to the word line WL. Each of the semiconductor body 210, the charge trapping layer 222, and the tunnel insulating layer 223 is formed along the inner wall of the memory hole MH and extends in the Z direction.

The cover insulating layer 221 is provided between the insulating layer 22 and the charge trapping layer 222. The cover insulating layer 221 protects the charge trapping layer 222 when a sacrifice layer 23 (FIG. 18) is replaced with the conductive layer 21 (in a replacing step). As a result, the cover insulating layer 221 prevents the charge trapping layer 222 from being etched. The cover insulating layer 221 that is not in contact with the insulating layer 22 may be removed together with the sacrifice layer 23. Although not illustrated, a portion of the cover insulating layer 221 that is not in contact with the insulating layer 22 may be left without being removed together with the sacrifice layer 23. When the portion of the cover insulating layer 221 that is not in contact with the insulating layer 22 is left, the cover insulating layer 221 is provided between the conductive layer 21 and the charge trapping layer 222.

The charge trapping layer 222 is provided between the block insulating layer 21a or the cover insulating layer 221 and the tunnel insulating layer 223. A portion or area of the charge trapping layer 222 sandwiched between the conductive layer 21 (the word line WL) and the semiconductor body 210 is a charge trapping portion or storage area of the memory cell MC. In the charge trapping portion or the storage area, for example, there is a trap site that traps charges. A threshold voltage of the memory cell MC changes depending on the amount of charges trapped in the charge trapping portion. That is, the charge trapping layer 222 functions as a storage layer that accumulates or stores injected charges. As a result, the memory cell MC can store data.

The tunnel insulating layer 223 is provided between the semiconductor body 210 and the charge trapping layer 222. When electrons are injected from the semiconductor body 210 into the charge trapping portion (writing operation) and when holes are injected from the semiconductor body 210 into the charge trapping portion (erasing operation), the electrons and the holes pass through the potential barrier of the tunnel insulating layer 223 (tunneling).

The tunnel insulating layer 223 is provided between the conductive layer 21 and the semiconductor body 210, the charge trapping layer 222 is provided between the tunnel insulating layer 223 and the conductive layer 21, and the block insulating layer 21a and the protective layer 21b are provided between the charge trapping layer 222 and the conductive layer 21. As a result, the charge trapping layer 222 introduces charges from the semiconductor body 210 through the tunnel insulating layer 223, or discharges charges from the semiconductor body 210 through the tunnel insulating layer 223. Meanwhile, the block insulating layer 21a and the protective layer 21b do not allow charges accumulated in the charge trapping layer 222 to pass through the conductive layer 21 and do not allow charges from the conductive layer 21 to pass through the charge trapping layer 222. As a result, the memory cell MC can store data in the charge trapping layer 222, or the memory cell MC can erase data from the charge trapping layer 222.

The internal space of the tubular semiconductor body 210 is buried by using the core layer 230. The shape of the core layer 230 is, for example, a columnar shape.

The conductive layer 21 functioning as a word line WL and a control gate is provided between a plurality of insulating layers 22 that are adjacent to each other in the Z direction. The conductive layer 21 faces the slit ST and is in contact with the slit ST in the Y direction. Although the details will be described later, the slit ST is formed when the conductive layer 21 is formed. The slit ST is used to substitute (replace) the sacrifice layer 23 (FIG. 18) with a material forming the conductive layer 21. After the material forming the conductive layer 21 is buried in the slit ST and between the insulating layers 22, the material of the conductive layer 21 in the slit ST is removed. At this time, as illustrated in FIGS. 3 and 5, the material forming the conductive layer 21 buried between the insulating layers 22 is left. The material forming the conductive layer 21 in the slit ST is removed, and each of the conductive layers 21 left between the insulating layers 22 is electrically isolated from each other. As a result, each of the conductive layers 21 can function as the word line WL. After that, the insulating layer 3 is provided (filled) inside the slit ST. FIG. 5 is an enlarged view of an area 110 in FIG. 3, illustrating one conductive layer 21 of the plurality of conductive layers 21 (the plurality of word lines WL).

As illustrated in FIGS. 3 and 5, the memory cell MC includes the conductive layer 21, the channel area (semiconductor layer), the tunnel insulating layer 223, the charge trapping layer 222, the cover insulating layer 221, the insulating layer 22 (first insulating layer), the block insulating layer 21a (second insulating layer), and the protective layer 21b in the directions (X direction and Y direction) intersecting the stacking direction (Z direction) of the stacked body 2. Further, the plurality of memory cells MC are arranged in the stacking direction (Z direction) of the plurality of conductive layers 21 and are provided for the plurality of conductive layers 21, respectively, among the alternately stacked insulating layers 22 and conductive layers 21. That is, the plurality of conductive layers 21 are connected to the plurality of memory cells MC, respectively.

As described above, in the memory cell MC, the semiconductor body 210 functions as the channel area, and the conductive layer 21 functions as the word line WL and the control gate. The charge trapping layer 222 functions as the storage layer that accumulates charges injected from the channel area. The plurality of memory cells MC are arranged in the stacking direction (Z direction) of the plurality of conductive layers 21, and the plurality of conductive layers are connected to the plurality of memory cells MC, respectively. The semiconductor device according to the present embodiment can control a voltage applied to the conductive layer 21 connected to the memory cell MC to control the writing operation or the erasing operation for the memory cell MC.

[Method for Manufacturing Conductive Layer 21 of Semiconductor Device 100]

Figure 6:
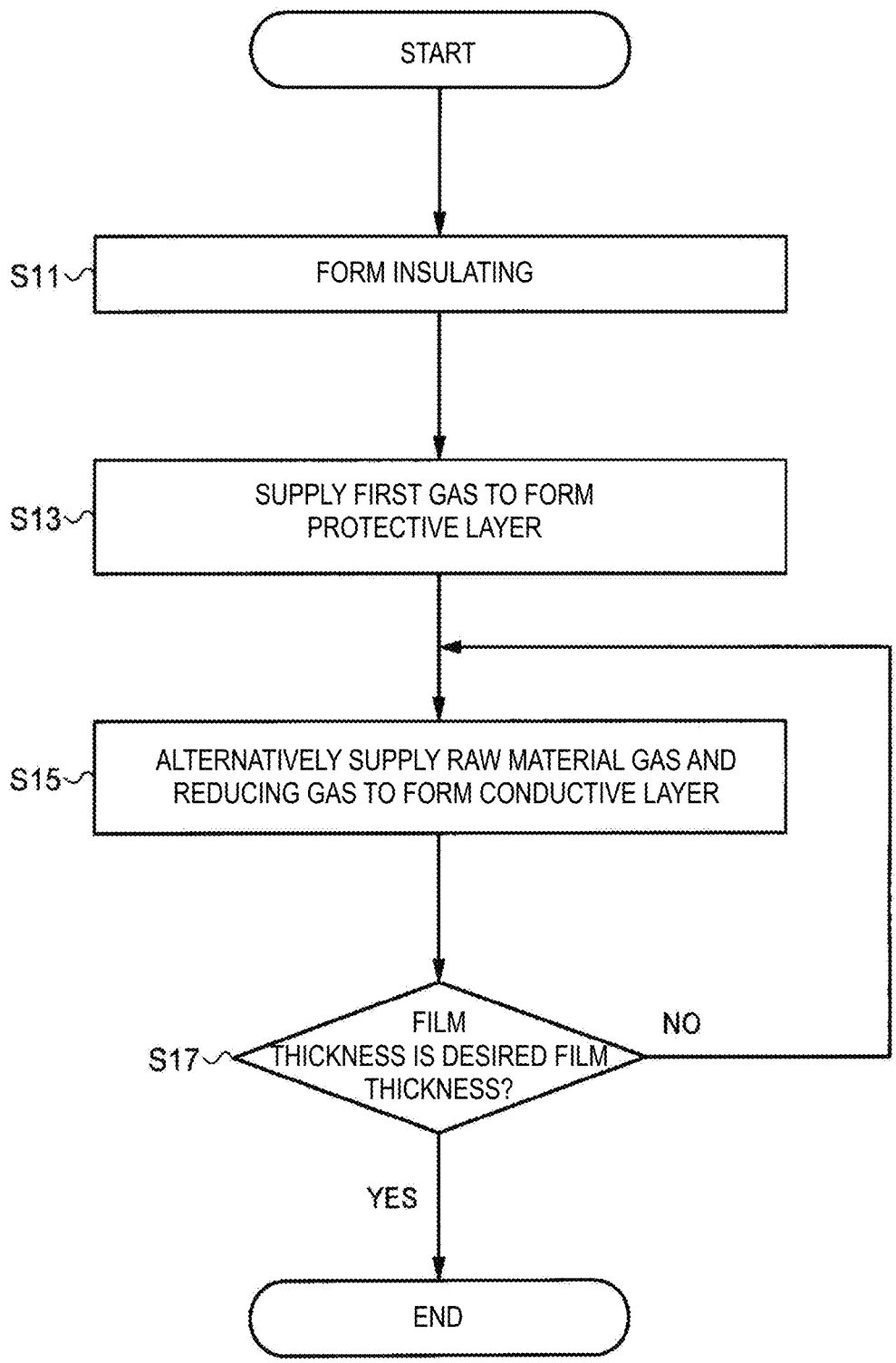
FIG. 6 is a flow chart illustrating a method for manufacturing a semiconductor device according to an embodiment.

A method for manufacturing the conductive layer 21 of the semiconductor device 100 according to the present embodiment will be described with reference to FIGS. 6 to 12. FIG. 6 is a flowchart illustrating a method for manufacturing the conductive layer 21 of the semiconductor device 100 according to the present embodiment. FIGS. 7 to 12 are diagrams illustrating a method for manufacturing the conductive layer 21 of the semiconductor device 100 according to the present embodiment. The method for manufacturing the semiconductor device 100 according to the present embodiment is not limited to the configurations illustrated in FIGS. 6 to 12. The descriptions of the configurations that are the same as or similar to those in FIGS. 1 to 5 may be omitted.

As described above, in the method for manufacturing the conductive layer 21 of the semiconductor device 100 according to the present embodiment, the slit ST is used to substitute (replace) the sacrifice layer 23 (FIG. 18) with the material forming the conductive layer 21. After the sacrifice layer 23 (FIG. 18) is removed, formation of the conductive layer 21 is started.

Figure 7:
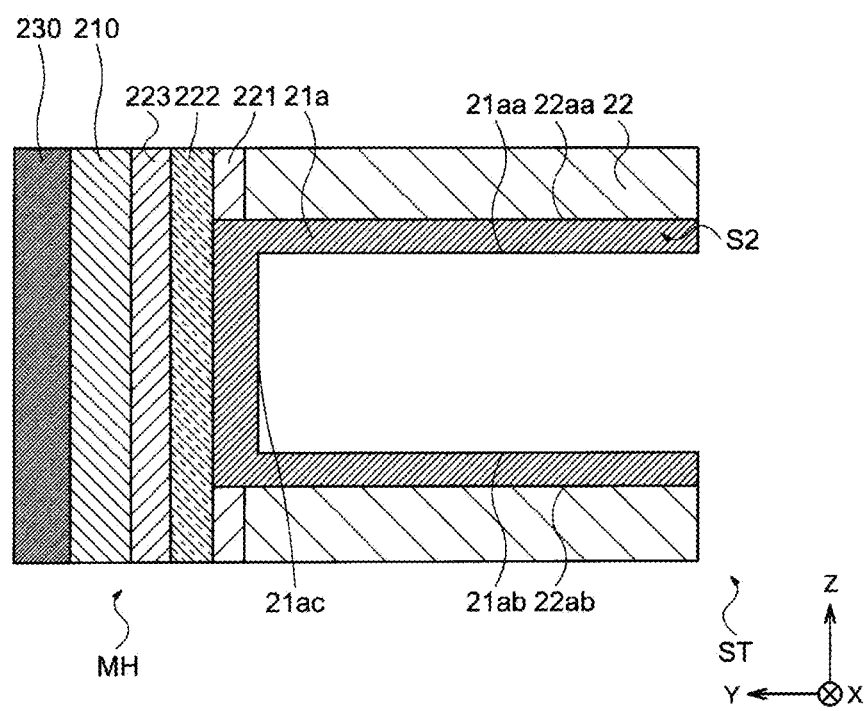
FIG. 7 is a diagram illustrating a method for manufacturing a semiconductor device according to an embodiment.

As illustrated in FIGS. 6 and 7, in step 11 (S11), the block insulating layer 21a is formed. The block insulating layer 21a is formed on the inner wall of a space S2 via the slit ST by using a thermal chemical vapor deposition (CVD) method, an atomic layer deposition (ALD) method, or the like. More specifically, the block insulating layer 21a is formed on the surface 22aa and surface 22ab of the insulating layer 22, a portion of the cover insulating layer 221, and a portion of the charge trapping layer 222. The block insulating layer 21a prevents back-tunneling of charges from the conductive layer 21 to the memory film 220 side. When the conductive layer 21 is formed, the block insulating layer 21a also functions as a seed layer that promotes stacking of a first metal element (formation of the conductive layer 21). In the present embodiment, the insulating layer 22 is also referred to as a first insulating layer, the surface 22aa and surface 22ab of the insulating layer 22 are also referred to as a first surface, and the block insulating layer 21a is also referred to as an aluminum oxide layer or a second insulating layer.

As a material for forming the block insulating layer 21a, for example, an insulating material containing a second metal element is used. In the present embodiment, for example, the second metal element is aluminum (Al), and the insulating material containing the second metal element is aluminum oxide ($Al_2O_3$). The thickness of aluminum oxide is, for example, 1 nm or more and 5 nm or less.

Figure 8:
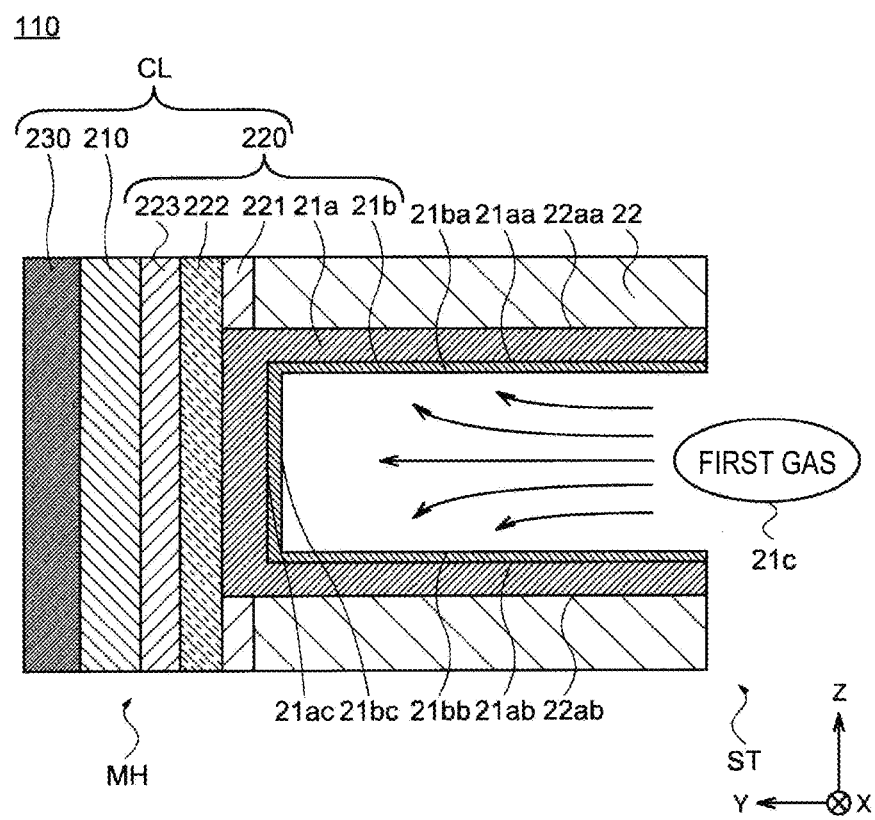
FIG. 8 is a diagram illustrating a method for manufacturing a semiconductor device according to an embodiment.

Next, as illustrated in FIGS. 6 and 8, in step 13 (S13), the protective layer 21b is formed. The protective layer 21b is formed on, for example, the surface 21aa, surface 21ab, and surface 21ac of the block insulating layer 21a. The protective layer 21b is formed by supplying a first gas 21c containing a third element via the slit ST by using a thermal CVD method or the like. The third element is, for example, carbon (C), nitrogen (N), or sulfur (S). The protective layer 21b may contain the third element, may contain the third element and the second metal element, may contain a bond between the third element and the second metal element, or may include a layer containing the bond between the third element and the second metal element. In the present embodiment, for example, the protective layer 21b includes a layer containing a bond between carbon and aluminum. The protective layer 21b may contain oxygen (O). The thickness of the protective layer 21b is at the level of one atomic layer, for example, about 0.03 nm. In order to facilitate understanding of the manufacturing method of the present embodiment, FIG. 8 illustrates the first gas 21c as a single element, but the first gas 21c is distributed in a space where the slit ST and the block insulating layer 21a are formed.

The conditions for forming the protective layer 21b by supplying the first gas 21c are, for example, that the temperature when supplying the first gas 21c is 300° C. or more and 650° C. or less, the pressure when the first gas 21c is supplied is 100 Pascal (Pa) or more and 10,000 Pa or less, and the time for supplying the first gas 21c is 3 minutes or less.

When the third element is carbon, the first gas 21c is, for example, a gas containing at least one of $CO$, $CO_2$, $CH_4$, $C_2H_2$, $C_2H_4$, $C_3H_6$, $C_3H_8$, $C_4F_6$, $C_4F_8$, and $CH_3OH$. The protective layer 21b may contain carbon, may contain carbon and aluminum, may contain a bond between carbon and aluminum, or may include a layer containing the bond between carbon and aluminum.

When the third element is nitrogen, the first gas is, for example, a gas containing $NH_3$. The protective layer 21b may contain nitrogen, may contain nitrogen and aluminum, may contain a bond between nitrogen and aluminum, or may include a layer containing the bond between nitrogen and aluminum.

When the third element is sulfur, the first gas is, for example, a gas containing $H_2S$. The protective layer 21b may contain sulfur, may contain sulfur and aluminum, may contain a bond between sulfur and aluminum, or may include a layer containing the bond between sulfur and aluminum.

The protective layer 21b is formed in contact with the block insulating layer 21a. As a result, when the conductive layer 21 (to be described later) is formed, the protective layer 21b prevents corrosion of the block insulating layer 21a due to chlorine or the like contained in the stack of the first metal element (formation of the conductive layer 21). The protective layer 21b also functions as a seed layer that promotes the stacking of the first metal element (formation of the conductive layer 21) when the conductive layer 21 is formed. That is, the first metal element can be easily stacked on the protective layer 21b by using the protective layer 21b. Further, since the thickness of the protective layer 21b is extremely thin at the level of one atomic layer, it is possible to prevent an increase in the resistance of the conductive layer 21 as the thickness of the protective layer 21b increases and the thickness of the conductive layer 21 decreases.

Figure 9:
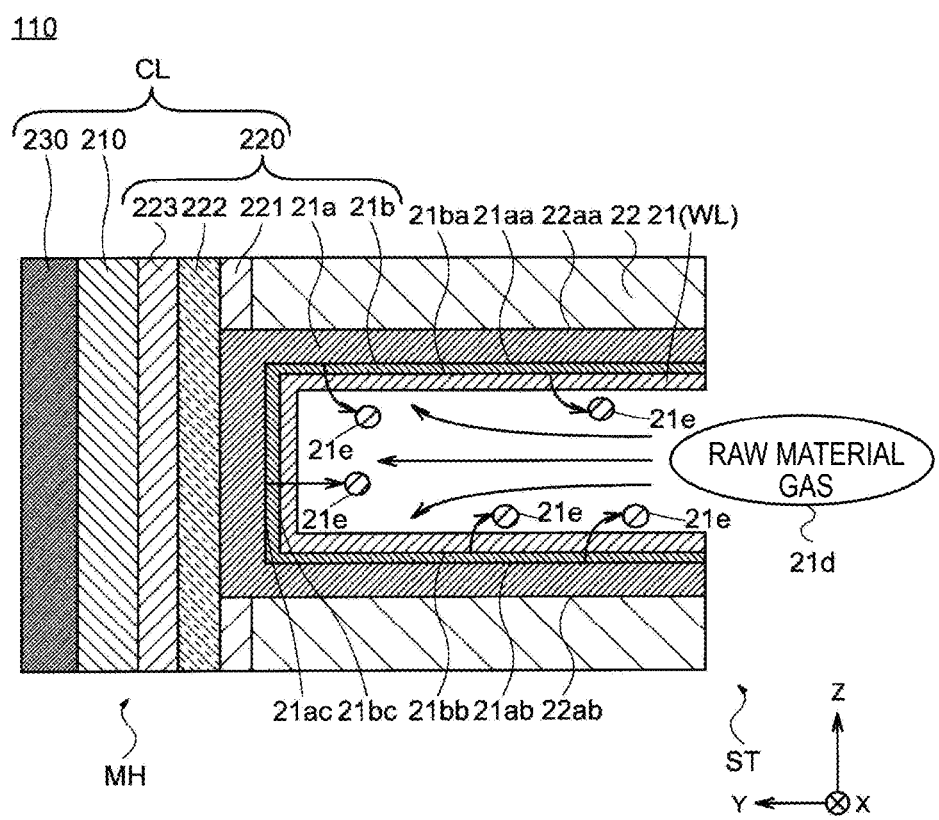
FIG. 9 is a diagram illustrating a method for manufacturing a semiconductor device according to an embodiment.
Figure 10:
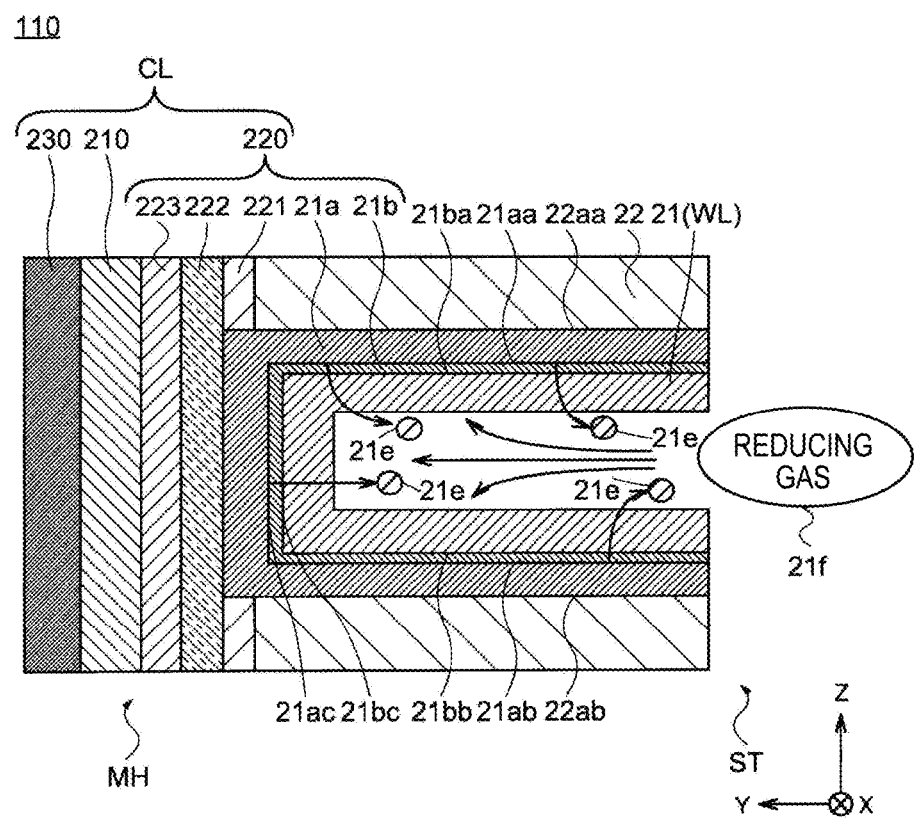
FIG. 10 is a diagram illustrating a method for manufacturing a semiconductor device according to an embodiment.

Next, as illustrated in FIGS. 6, 9, 10, and 11, in step 15 (S15), the conductive layer 21 is formed. The conductive layer 21 is formed on, for example, the surface 21ba, surface 21bb, and surface 21bc of the protective layer 21b and the surface (inner wall) of the slit ST. The conductive layer 21 is formed by using a thermal CVD method, an ALD method, or the like, and by alternately supplying a raw material gas 21d containing the first metal element, and a reducing gas 21f via the slit ST in an atmosphere where the temperature is 500° C. to 600° C. In order to facilitate understanding of the manufacturing method of the present embodiment, FIG. 9 illustrates the raw material gas 21d as a single element. Further, in order to facilitate understanding of the manufacturing method of the present embodiment, FIG. 10 illustrates the reducing gas 21f as a single element. However, the raw material gas 21d and the reducing gas 21f are distributed in a space where the slit ST and the block insulating layer 21a are formed. In the present embodiment, the raw material gas is referred to as a material gas.

As a material for forming the conductive layer 21, for example, a conductive material containing the first metal element is used. For example, the first metal element is molybdenum (Mo). The raw material gas containing the first metal element is a gas containing molybdenum and chlorine (Cl), for example, a gas such as $MoCl_5$, $MoOCl_4$, or $MoO_2Cl_2$. Chlorine is an impurity contained in the raw material gas. The volume density of chlorine in the conductive layer 21 is $1 \times 10^{15}$ atoms/cm$^3$ or more and is $1 \times 10^{20}$ atoms/cm$^3$ or less. The reducing gas 21f is, for example, a hydrogen ($H_2$) gas, ammonia ($NH_3$), or the like.

Further, in the present embodiment, for example, the second metal element is aluminum, the third element is carbon, the protective layer 21b includes a layer containing a bond between carbon and aluminum, the first metal element is molybdenum, the raw material gas containing the first metal element is a gas containing molybdenum and chlorine, the reducing gas is a hydrogen gas, and the conductive layer 21 contains molybdenum and chlorine. As illustrated in FIGS. 9 and 10, when the gas containing molybdenum and chlorine and the hydrogen gas are alternately supplied in the process of forming the conductive layer 21, chlorine contained in the raw material gas or chlorine contained in the conductive layer 21, the hydrogen gas, and carbon contained in the protective layer 21b chemically react with each other, so that a gas 21e containing chlorine is desorbed from the surface 21aa, surface 21ab, and surface 21ac of the block insulating layer 21a and the surface 21ba, surface 21bb, and surface 21bc of the protective layer 21b. As a result, molybdenum is adsorbed on a portion where chlorine contained in the conductive layer 21 is desorbed, to promote formation of a layer containing molybdenum in the conductive layer 21. That is, molybdenum is gradually deposited inside the protective layer 21b in the space S2 to form a layer containing molybdenum.

Figure 11:
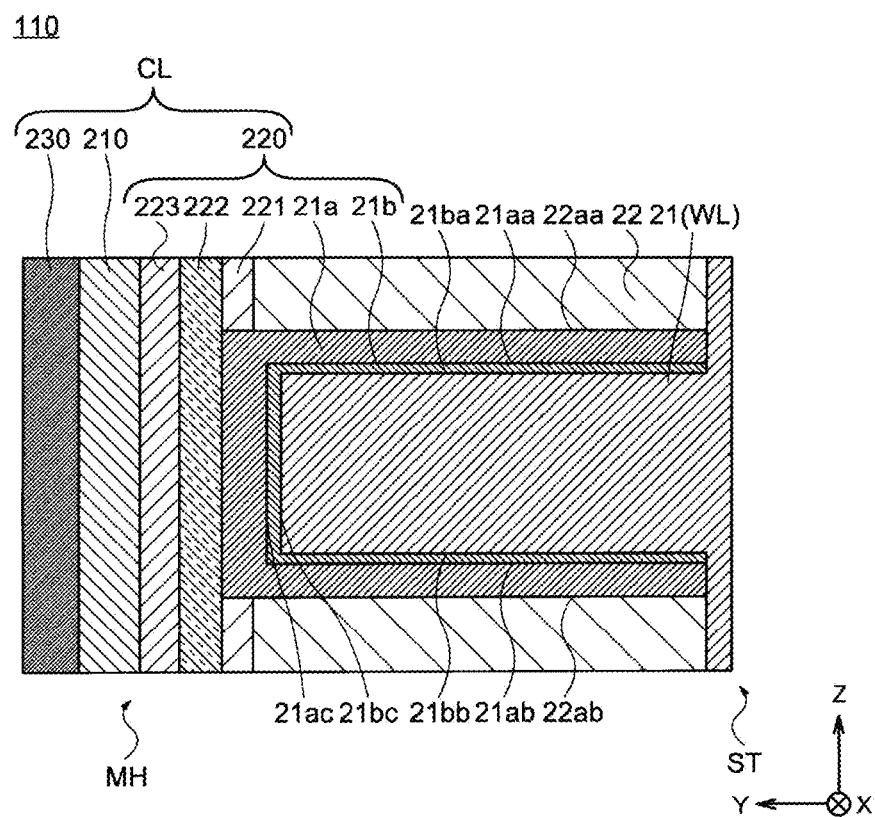
FIG. 11 is a diagram illustrating a method for manufacturing a semiconductor device according to an embodiment.

Next, as illustrated in FIG. 6, in step 17 (S17), when the film thickness of the conductive layer 21 is not a desired film thickness (NO), the conductive layer 21 does not completely fill the inside of the protective layer 21b in the space S2, as illustrated in FIGS. 9 and 10. As a result, step 15 (S15) is repeatedly executed until the film thickness of the conductive layer 21 reaches the desired film thickness. Meanwhile, as illustrated in FIG. 6, in step 17 (S17), when the film thickness of the conductive layer 21 is the desired film thickness (YES), since the conductive layer 21 completely fills the inside of the protective layer 21b in the space S2, the formation of the conductive layer 21 inside the protective layer 21b in the space S2 is completed, as illustrated in FIG. 11.

Figure 12:
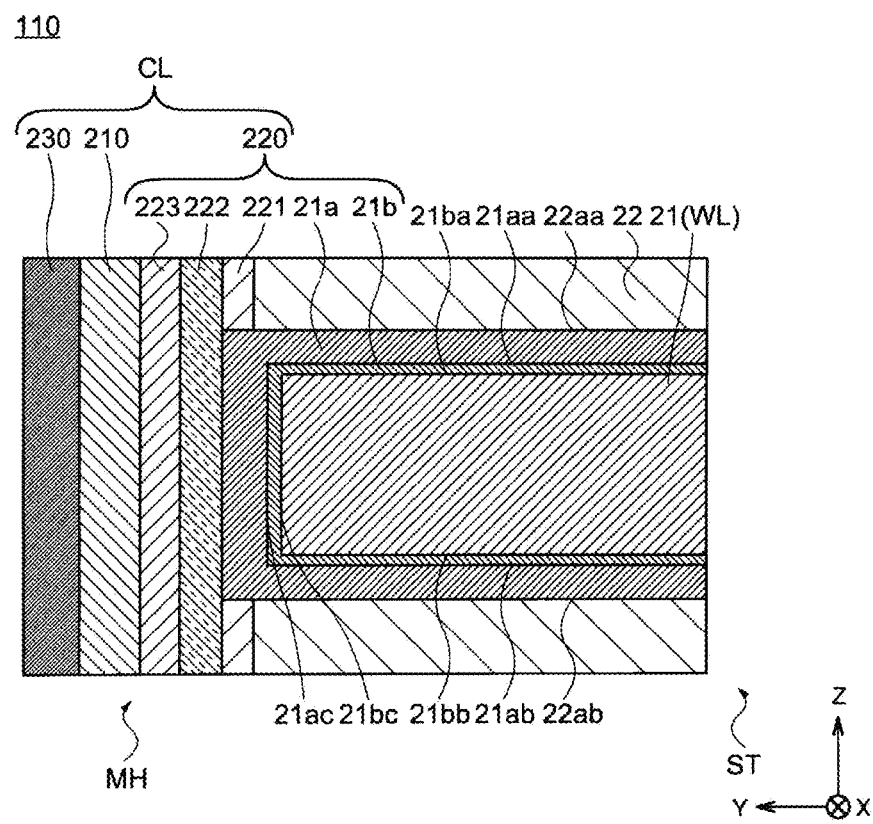
FIG. 12 is a diagram illustrating a method for manufacturing a semiconductor device according to an embodiment.

Next, as illustrated in FIG. 12, the conductive layer 21 provided on the side wall of the insulating layer 22 in the slit ST is removed while leaving the conductive layer 21 provided inside the protective layer 21b in the space S2 between the insulating layers 22. For example, the conductive layer 21 is etched by wet-etching via the slit ST. An etching solution used for wet-etching is, for example, a mixed solution containing phosphoric acid. As described above, the conductive layer 21 provided on the side wall of the insulating layer 22 in the slit ST is removed (etched-back). As a result, for example, as illustrated in FIG. 2, the conductive layers 21 provided inside the protective layers 21b in a plurality of spaces S2 arranged in the Z direction are electrically isolated from each other. Therefore, each of the conductive layers 21 electrically isolated from each other can function as a word line WL and a control gate.

In the present embodiment, the surface 21aa, surface 21ab, and surface 21ac of the block insulating layer 21a are referred to as a second surface, and the surface 21ba, surface 21bb, and surface 21bc of the protective layer 21b are referred to as a third surface. In the present embodiment, although not illustrated, the conductive layer 21 may include grain boundaries.

Figure 14:
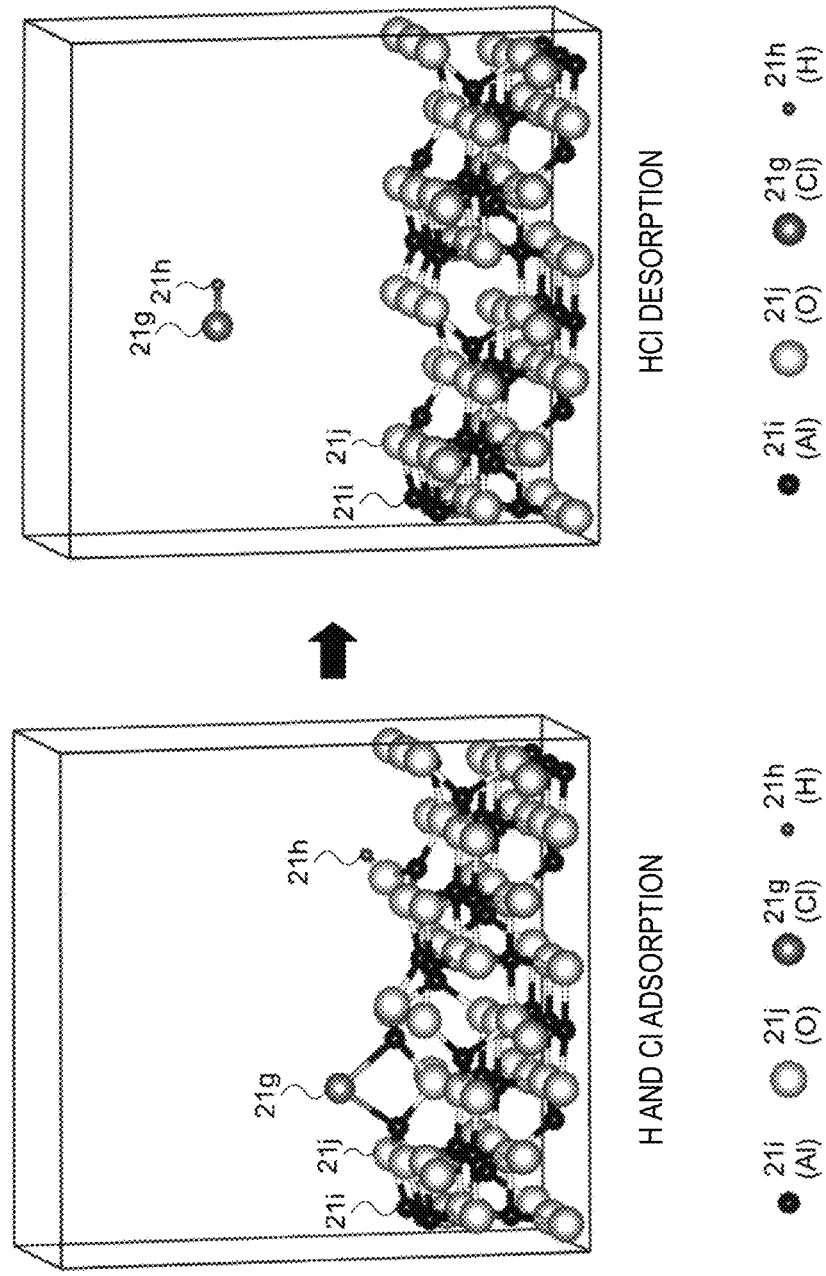
FIG. 14 is a diagram illustrating a calculation result of a crystal state of an insulating layer when a gas containing hydrogen is supplied.
Figure 16:
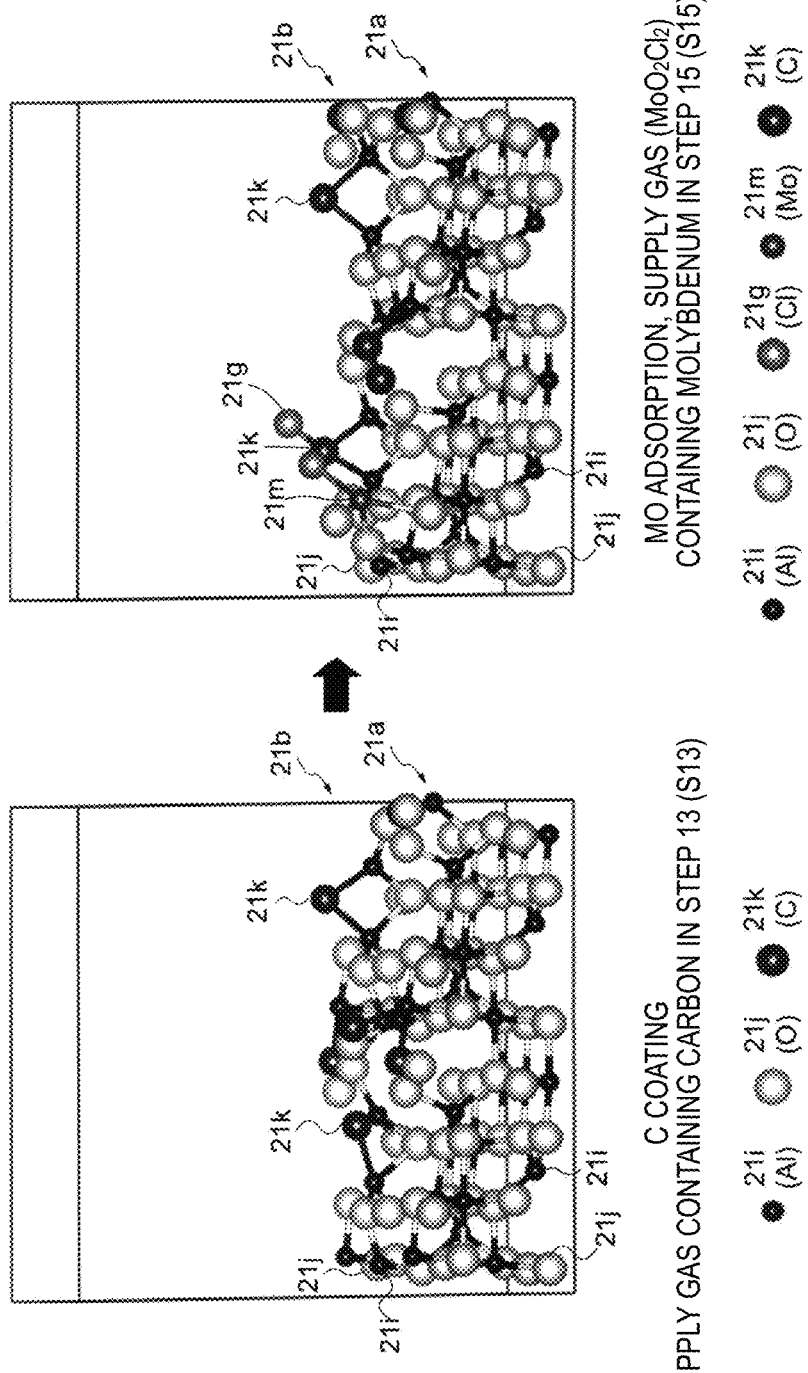
FIG. 16 is a diagram illustrating a calculation result of a crystal state when a gas containing carbon is supplied and the calculation result of a crystal state when a raw material gas is supplied.
Figure 17:
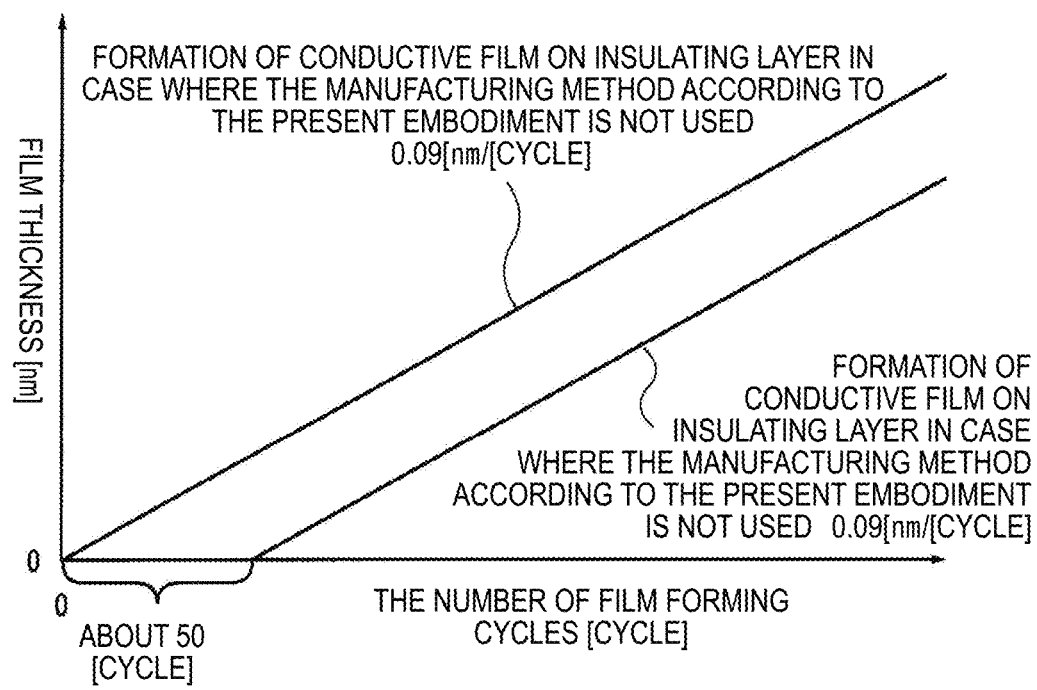
FIG. 17 is a diagram illustrating a relationship between a film formation cycle and a film thickness in a method for manufacturing a semiconductor device according to an embodiment and a manufacturing method in a case where the method for manufacturing the semiconductor device according to the embodiment is not used.

In the method for manufacturing the conductive layer 21 of the semiconductor device 100 described with reference to FIGS. 6 to 12, an example of the structure (mechanism) of the formation of the conductive layer 21 will be described with reference to FIGS. 13 to 17. FIG. 13 is a diagram illustrating the first-principle calculation result of adsorption energy of a gas adsorbed on the surface of each material and desorption energy of a gas desorbed from the surface of each material. FIG. 14 is a diagram illustrating the calculation result of a crystal state of an insulating layer when a gas containing hydrogen is supplied. FIG. 15 is a diagram illustrating the first-principle calculation result of desorption energy of a gas desorbed from the block insulating layer 21a of the semiconductor device 100 according to the present embodiment. FIG. 16 is a diagram illustrating the calculation result of a crystal state when a gas containing carbon is supplied and the calculation result of a crystal state when a raw material gas is supplied, in the method for manufacturing the semiconductor device 100 according to the present embodiment. FIG. 17 is a diagram illustrating the relationship between a film formation cycle and a film thickness in the method for manufacturing the conductive layer 21 of the semiconductor device 100 according to the present embodiment and a manufacturing method in a case where the method for manufacturing the conductive layer 21 of the semiconductor device 100 according to the present embodiment is not used. The structure of the method for manufacturing the semiconductor device 100 according to the present embodiment is not limited to the configurations illustrated in FIGS. 13 to 17. The descriptions of the configurations that are the same as or similar to those in FIGS. 1 to 12 may be omitted.

FIG. 13 illustrates an example in which the surface (base) of the material is the Mo (110) plane, the $\gamma$-$Al_2O_3$ (100) plane, or the titanium nitride (TiN) (110) plane, an adsorbed gas is a gas containing $MoO_2Cl_2$ or $H_2$, and a desorbed gas is a gas containing $H_2O$ or HCl. In FIG. 13, each numerical value indicates the easiness of adsorption of the adsorbed gas or the easiness of desorption of the desorbed gas. When the numerical value is smaller, the adsorbed gas is more likely to be adsorbed and is less likely to be desorbed. When the numerical value is larger, the desorbed gas is less likely to be desorbed and is less likely to be adsorbed. In particular, the desorption energy of Cl is 2.76 eV for the Mo (110) plane, 4.38 eV for the $\gamma$-$Al_2O_3$ (100) plane, and 2.20 eV for the titanium nitride (TiN) (110) plane. Therefore, it can be seen that Cl is likely to be adsorbed on and is unlikely to be desorbed from the surface of the material.

When a gas containing hydrogen is supplied, for example, chlorine 21g and hydrogen 21h are adsorbed on the surface of $Al_2O_3$, and chlorine 21g, hydrogen 21h, aluminum 21i, and oxygen 21j are bonded as illustrated in the left side of FIG. 14. As illustrated in the right side of FIG. 14, in $Al_2O_3$, chlorine 21g and hydrogen 21h adsorbed on the surface of $Al_2O_3$ are bonded and desorbed. However, as illustrated in FIG. 13, Cl is likely to be adsorbed on and is unlikely to be desorbed from the surface of the material. For example, $Al_2O_3$ is likely to be corroded if it contains chlorine. As illustrated in FIG. 13, when a conductive layer is formed on $Al_2O_3$, Cl contained in a raw material gas forming the conductive layer is likely to be adsorbed on and is unlikely to be desorbed from $Al_2O_3$. As a result, Cl remains in $Al_2O_3$ so that $Al_2O_3$ is corroded. Further, since Cl remains in $Al_2O_3$, it is difficult for a metal element forming the conductive layer to be adsorbed or deposited on $Al_2O_3$. As a result, it takes time to form the conductive layer on $Al_2O_3$.

In the present embodiment, in order to desorb Cl contained in the surface of the material, gases described in the types of gases as illustrated in FIG. 15 are used to modify the surface of an insulating film (e.g., $Al_2O_3$) containing a metal element. FIG. 15 illustrates an example in which the types of gases are a gas containing carbon (e.g., a gas containing $CH_4$), a gas containing nitrogen (e.g., a gas containing $NH_3$), and a gas containing sulfur (e.g., a gas containing $H_2S$), and the desorbed gas ($XClH_n$ desorption (X is any of C, N, and S)) is a gas containing $CClH_3$ ($CClH_3$ desorption), a gas containing $NClH_2$ ($NClH_2$ desorption), and a gas containing SClH (SClH desorption). In FIG. 15, as in FIG. 13, the desorbed gas is less likely to be desorbed and is more likely to be adsorbed when the numerical value is larger. The desorption energy when Cl and C contained on the surface of the material are reacted by using the gas containing $CH_4$ illustrated in FIG. 15 to desorb Cl is 0.11 eV, and the desorption energy when Cl and N contained in the surface of the material are reacted by using the gas containing $NH_3$ illustrated in FIG. 15 to desorb Cl is 1.60 eV. The desorption energy when the surface of the material is modified by using the gas containing $CH_4$ illustrated in FIG. 15 is significantly improved as compared with the desorption energy of Cl for the surface of the material illustrated in FIG. 13. Further, the desorption energy (3.49 eV) when the surface of the material is modified by using the gas containing $H_2S$ is improved as compared with the desorption energy (4.38 eV) from $Al_2O_3$ illustrated in FIG. 13.

In the present embodiment, as illustrated in the left side of FIG. 16 ($CH_4$ flow (C adsorption, C coating)), for example, in step 13 (S13) described with reference to FIGS. 6 and 8, the first gas containing $CH_4$ is supplied onto $Al_2O_3$, which is the block insulating layer 21a, to form a layer containing Al and C (the protective layer 21b). For example, the layer containing Al and C, which is the protective layer 21b, is formed on $Al_2O_3$, which is the block insulating layer 21a, so that aluminum 21i, oxygen 21j, and carbon 21k are bonded as illustrated in the left side of FIG. 16. As a result, the layer containing Al and C can protect (coat) the surface of $Al_2O_3$. That is, the surface of $Al_2O_3$ can be modified in step 13 (S13).

In the present embodiment, as illustrated in the right side of FIG. 16 ($MoO_2Cl_2$ flow (Mo adsorption)), for example, in step 15 (S15) described with reference to FIGS. 6, 9, and 10, a gas containing Mo and Cl (raw material gas, for example, $MoO_2Cl_2$) and a reducing gas ($H_2$) are alternately supplied onto the protective layer 21b to form the conductive layer 21 containing Mo. For example, a layer containing Al and C, which is the protective layer 21b, is formed on $Al_2O_3$, which is the block insulating layer 21a, so that chlorine 21g, aluminum 21i, oxygen 21j, carbon 21k, and molybdenum 21m are bonded as illustrated in the right side of FIG. 16. Further, from a crystalline state illustrated in the right side of FIG. 16, the gas containing Mo and Cl ($MoO_2Cl_2$), the reducing gas ($H_2$), and the layer containing Al and C, which is the protective layers 21b, react with each other, so that, for example, a gas containing $CClH_3$ is desorbed and molybdenum 21m is adsorbed or deposited on the protective layer 21b. As a result, a layer containing molybdenum 21m (the conductive layer 21) is formed on the protective layer 21b.

For example, in the case where the manufacturing method according to the present embodiment is not used, as described above, Cl is likely to be adsorbed on and is unlikely to be desorbed from $Al_2O_3$. Therefore, Cl remains on $Al_2O_3$, so that a metal element forming the conductive layer is unlikely to be adsorbed or deposited on $Al_2O_3$. For example, as illustrated in FIG. 17, in the case where the manufacturing method according to the present embodiment is not used, when the conductive layer 21 is formed on the block insulating layer 21*a* at a formation rate of 0.09 [nm/cycle] (0.09 nm film formation per cycle), the conductive layer 21 is formed with a delay of about 50 cycles in the film forming cycle. In the present embodiment, a delay in the start of film formation is referred to as, for example, "with an incubation cycle," and no delay in the start of film formation is referred to as, for example, "without an incubation cycle."

Meanwhile, in the case where the manufacturing method according to the present embodiment is used, as described above, for example, the first gas containing $CH_4$ is supplied onto $Al_2O_3$, which is the block insulating layer 21*a*, to form a layer containing Al and C (the protective layer 21*b*). The layer containing Al and C, which is the protective layer 21*b*, is formed on $Al_2O_3$, which is the block insulating layer 21*a*, and further, a raw material gas containing a metal atom and Cl, a reducing gas ($H_2$), and a layer containing Al and C, which is the protective layer 21*b*, react with each other, so that, for example, a gas containing $CClH_3$ is desorbed to form the conductive layer 21 containing the metal atom. Using the manufacturing method according to the present embodiment promotes that Cl is desorbed from $Al_2O_3$ and the metal element forming the conductive layer 21 is adsorbed or deposited on $Al_2O_3$. For example, as illustrated in FIG. 17, in the case where the manufacturing method according to the present embodiment is used, when the conductive layer 21 is formed on the block insulating layer 21*a* at a formation rate of 0.09 [nm/cycle] (0.09 nm film formation per cycle), the conductive layer 21 is formed without an incubation cycle. In addition, the conductive layer 21 containing a metal atom can be formed without an incubation cycle. Therefore, the conductive layer 21 is uniformly formed on $Al_2O_3$. As a result, it is possible to improve the coverability of the conductive layer 21 with respect to a step by using the manufacturing method according to the present embodiment, as compared with a case where the film thickness of the conductive layer 21 is not uniformly formed. Further, since the conductive layer 21 can be formed without an incubation cycle, it is possible to calculate the film thickness (thickness of layer) formed with respect to the number of film forming cycles.

It is possible to form the protective layer 21*b* on the block insulating layer 21*a* by using the semiconductor device 100 and the method for manufacturing the semiconductor device 100 according to the present embodiment. As a result, since a layer contained in the protective layer 21*b*, for example, a layer containing a bond between aluminum (Al) and carbon (C) can protect the block insulating layer 21*a*, it is possible to prevent the block insulating layer 21*a* from being corroded.

Further, for example, it is possible to desorb a gas containing chlorine from the protective layer 21*b* by reacting a raw material gas for forming the conductive layer 21 with carbon (C) and chlorine (Cl) which is impurities. As a result, it is possible to deposit metal atoms forming the conductive layer 21 contained in the raw material gas on the protective layer 21*b* and start formation of the conductive layer 21 with the deposited metal atoms as nuclei. Therefore, the incubation cycle can be reduced without delaying the formation of the conductive layer 21. As a result, it is possible to form the conductive layer 21 on a step without impairing the coverability of the conductive layer 21 with respect to the step by using the semiconductor device 100 and the method for manufacturing the semiconductor device 100 according to the present embodiment.

As described above, it is possible to improve the reliability and productivity of an insulating layer and a conductive layer that are alternately stacked by using the semiconductor device 100 and the method for manufacturing the semiconductor device 100 according to the present embodiment.

As described above, the semiconductor device 100 according to the present embodiment has the stacked body 2 including the conductive layer 21, the insulating layer 22 (the first insulating layer), the block insulating layer 21*a* (aluminum oxide ($Al_2O_3$) layer), and the protective layer 21*b*. The conductive layer 21 and the insulating layer 22 are alternately stacked. The conductive layer 21 contains molybdenum (Mo, the first element). The insulating layer 22 has the surface 22*aa* and surface 22*ab* (the first surface). The block insulating layer 21*a* is in contact with the surface 22*aa* and surface 22*ab* and is provided between the surface 22*aa* and the surface 22*ab* and the conductive layer 21. That is, the block insulating layer 21*a* is in contact with the insulating layer 22 and the conductive layer 21. Further, the block insulating layer 21*a* contains aluminum (Al, the second element) and has the surface 21*aa*, surface 21*ab*, and surface 21*ac* (the second surface). The protective layer 21*b* is in contact with the surface 21*aa*, surface 21*ab*, and surface 21*ac*. Further, the protective layer 21*b* contains the bond between carbon (C, the third element) and aluminum and has the surface 21*ba*, surface 21*bb*, and surface 21*bc* (the third surface). The surface 21*ba*, surface 21*bb*, and surface 21*bc* are in contact with the conductive layer 21. That is, the protective layer 21*b* is in contact with the block insulating layer 21*a* and the conductive layer 21. In the present embodiment, for the sake of convenience, a plane or surface may be defined as a portion where, for example, a first film or a first layer and a second film or a second layer is in contact.

Further, the stacked body 2 has the plurality of memory holes MH (second opening), the semiconductor body 210 (semiconductor layer), the cover insulating layer 221, the charge trapping layer 222, and the tunnel insulating layer 223. The plurality of memory holes MH extend in the stacking direction (Z direction) of the stacked body 2 and are provided inside the insulating layer 22 and the conductive layer 21. The plurality of memory holes MH are openings different from the plurality of slits ST (the first openings). The semiconductor body 210 is provided in the tubular shape so as to extend in the stacking direction (Z direction) of the stacked body 2 along the inside of the plurality of memory holes MH. The cover insulating layer 221 is provided between the charge trapping layer 222 and the insulating layer 22 or the conductive layer 21. The charge trapping layer 222 is provided between the tunnel insulating layer 223 and the conductive layer 21. The tunnel insulating layer 223 is provided between the conductive layer 21 and the semiconductor body 210. In the present embodiment, for example, a stopper layer 3*s* (an insulator, FIG. 22) extends in the stacking direction (Z direction) of the stacked body 2 along the inside of the plurality of slits ST.

Further, in the method for manufacturing the semiconductor device 100 according to the present embodiment, the insulating layer 22 (the first insulating layer) having the surface 22*aa* and surface 22*ab* (the first surface) is formed, the block insulating layer 21*a* (the aluminum oxide ($Al_2O_3$) layer) having the surface 21*aa*, surface 21*ab*, and surface 21*ac* (the second surface) is formed on the surface 22*aa* and surface 22*ab*, the protective layer 21*b* having the surface 21*ba*, surface 21*bb*, and surface 21*bc* (the third surface) is formed on the surface 21*aa*, surface 21*ab*, and surface 21*ac* (the second surface), and the conductive layer 21 is formed on the surface 21ba, surface 21bb, and surface 21bc (the third surface). That is, the insulating layer 22 is formed on the substrate, the block insulating layer 21a (the aluminum oxide layer) is formed on the insulating layer 22, the protective layer 21b is formed on the block insulating layer 21a (the aluminum oxide layer), and the conductive layer 21 is formed on the protective layer 21b. The block insulating layer 21a contains aluminum (Al, the second element), the protective layer 21b contains the bond between carbon (C, the third element) and aluminum (Al, the second element), and the conductive layer 21 contains molybdenum (Mo, the first element). When the protective layer 21b is formed, a gas (the first gas) containing one of carbon, nitrogen (N, the third element), and sulfur (S, the third element) is supplied. When the conductive layer 21 is formed, a material gas containing molybdenum (Mo, the first element) is supplied and a gas ($H_2$, the reducing gas) containing hydrogen that reduces the material gas is supplied.

Further, in the method for manufacturing the semiconductor device 100 according to the present embodiment, the plurality of insulating layers 22 (the first insulating layers) and the plurality of sacrifice layers 23 are alternately stacked on the substrate 10 to form the stacked body 2. The plurality of slits ST (the first openings) extending in the stacking direction (Z direction) of the stacked body 2 are formed in common to the plurality of insulating layers 22 and the plurality of sacrifice layers 23. The plurality of sacrifice layers 23 are removed through the plurality of slits ST to form the plurality of spaces S2 from which the plurality of sacrifice layers 23 are removed, between the plurality of insulating layers 22. The first gas, the material gas, and the reducing gas are supplied to the plurality of spaces S2 via the plurality of slits ST to form the block insulating layer 21a (the aluminum oxide ($Al_2O_3$) layer), the protective layer 21b, and the conductive layer 21 in each of the plurality of spaces S2 via the plurality of slits ST. The conductive layer 21 provided in the plurality of slits ST is removed while leaving the block insulating layer 21a, the protective layer 21b, and the conductive layer 21 provided in each of the plurality of spaces S2.

[Method for Manufacturing Semiconductor Device 100]

The method for manufacturing the semiconductor device 100 according to the present embodiment will be described with reference to FIGS. 1, 2, and 18 to 25. FIGS. 18 to 25 are diagrams illustrating the method for manufacturing the semiconductor device 100 according to the present embodiment. The method for manufacturing the semiconductor device 100 according to the present embodiment is not limited to the manufacturing method illustrated in FIGS. 18 to 25. The descriptions of the configurations that are the same as or similar to those in FIGS. 1 to 17 may be omitted. Similarly to FIG. 2, in FIGS. 18 to 25, the element isolation area 10i, the active area AA, the transistor Tr, the wiring 11aa, the wiring 11ab, and the insulating layer 11d illustrated in FIG. 1 are omitted.

As illustrated in FIG. 1, the element isolation area 10i is formed in the substrate 10, and the transistor Tr is formed in the active area AA. Next, the insulating layer 11 is formed on the substrate 10. The insulating layer 11 includes, for example, the gate electrode of the transistor Tr, the gate insulating layer, the wiring 11aa, the wiring 11ab, and the insulating layer 11d. That is, the insulating layer 11 includes a multilayer wiring structure in which insulating layers and wiring layers are alternately stacked. As a material for forming the insulating layer 11, for example, silicon oxide may be used. Next, the conductive layer 12 is formed on the insulating layer 11d. As a material for forming the conductive layer 12, for example, conductive metal such as tungsten is used.

Figure 18:
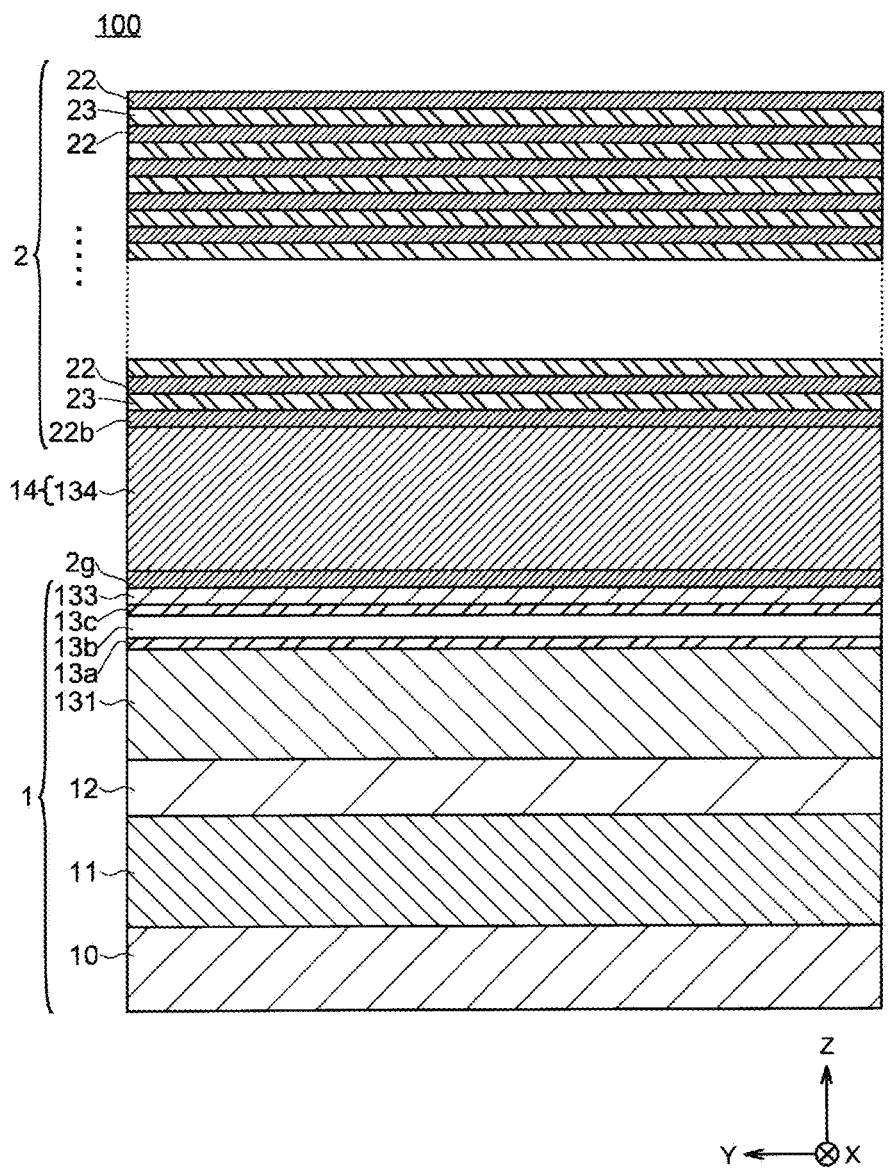
FIG. 18 is a diagram illustrating a method for manufacturing a semiconductor device according to an embodiment.

Next, as illustrated in FIG. 18, the semiconductor layer 131 is formed on the conductive layer 12. Next, an intermediate layer 13a is formed on the semiconductor layer 131. As a material for forming the intermediate layer 13a, for example, a silicon oxide film is used. Next, a sacrifice layer 13b is formed on the intermediate layer 13a. As a material for forming the sacrifice layer 13b, for example, impurity-doped silicon or non-impurity-doped silicon is used. Next, an intermediate layer 13c is formed on the sacrifice layer 13b. As a material for forming the intermediate layer 13c, for example, a silicon oxide film is used. Next, the semiconductor layer 133 is formed on the intermediate layer 13c. For example, the semiconductor portion 13 is formed by the semiconductor layer 131, the intermediate layer 13a, the sacrifice layer 13b, the intermediate layer 13c, and the semiconductor layer 133. As the material for forming the semiconductor portion 13, for example, a semiconductor material such as silicon is used. As the material for forming the semiconductor layer 131, the semiconductor layer 132, and the semiconductor layer 133, for example, impurity-doped silicon or non-impurity-doped silicon is used. As described above, the base portion 1 is formed.

Subsequently, as illustrated in FIG. 18, the insulating layer 2g is formed on the semiconductor layer 133. Next, a semiconductor layer 134 is formed on the insulating layer 2g. As the material for forming the insulating layer 2g, for example, silicon oxide, a dielectric having a relative dielectric constant higher than that of the silicon oxide, metal oxide, or the like is used. As described above, the semiconductor portion 14 is formed. Next, an insulating layer 22b is formed on the semiconductor layer 134. Further, the sacrifice layer 23 and the insulating layer 22 are alternately stacked on the insulating layer 22b. As the material for forming the insulating layer 22, for example, silicon oxide is used. The insulating layer 22 is, for example, a TEOS layer. The TEOS layer is a silicon oxide layer made from tetra ethyl ortho silicate (TEOS) as a raw material. The TEOS layer is formed by using, for example, a chemical vapor deposition (CVD) method. As the material for forming the insulating layer 22b, the same material as the material for forming the insulating layer 22 described above is used. As the material for forming the sacrifice layer 23, for example, a silicon nitride film is used. As described above, the stacked body 2 is formed above the semiconductor portion 13.

Figure 19:
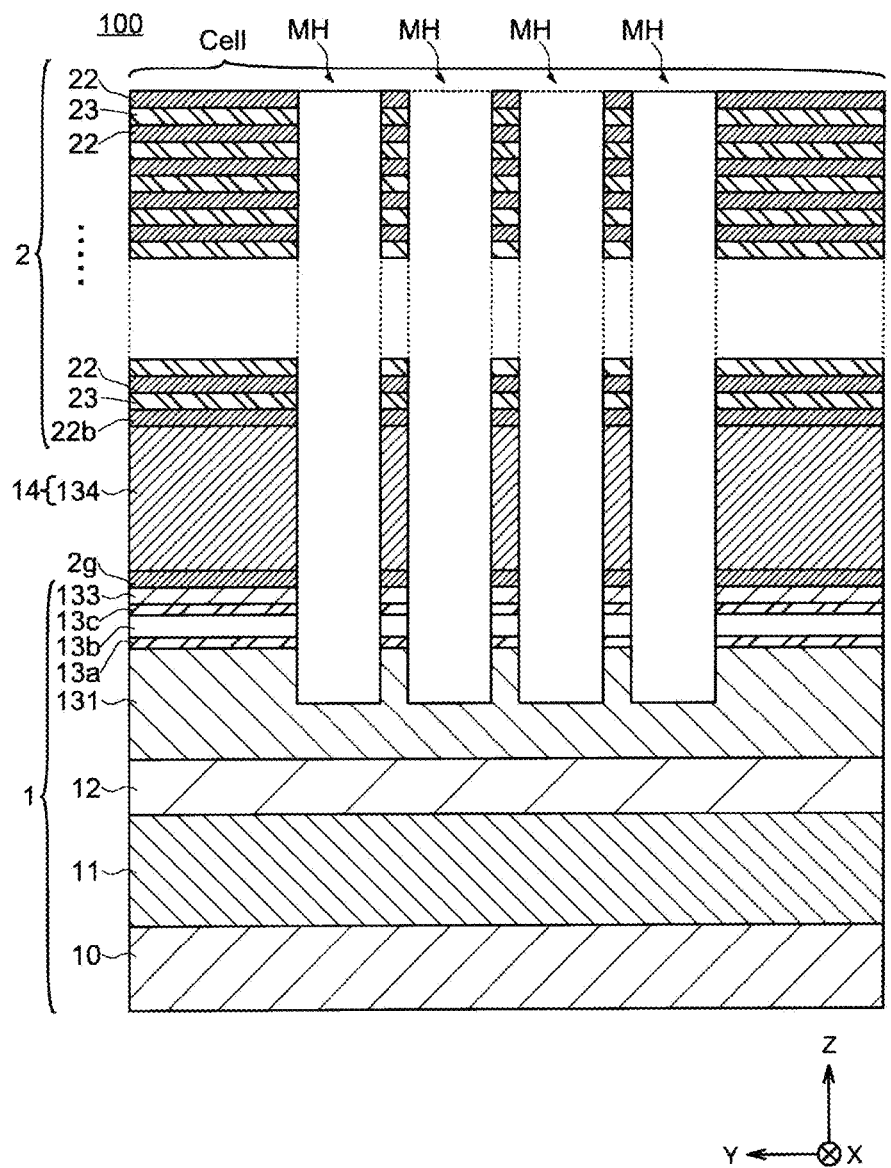
FIG. 19 is a diagram illustrating a method for manufacturing a semiconductor device according to an embodiment.

Subsequently, as illustrated in FIG. 19, in a cell area (not illustrated) in a part of the base portion 1 and the stacked body 2, the stacked body 2, the semiconductor layer 134, the insulating layer 2g, the semiconductor layer 133, the intermediate layer 13c, the sacrifice layer 13b, the intermediate layer 13a, and the semiconductor layer 131 are anisotropically etched to form a memory hole MH. The memory hole MH is an opening. The memory hole MH is formed so as to extend in the stacking direction of the stacked body 2, and is provided from the upper end of the stacked body 2 to the middle of the semiconductor layer 131.

Figure 20:
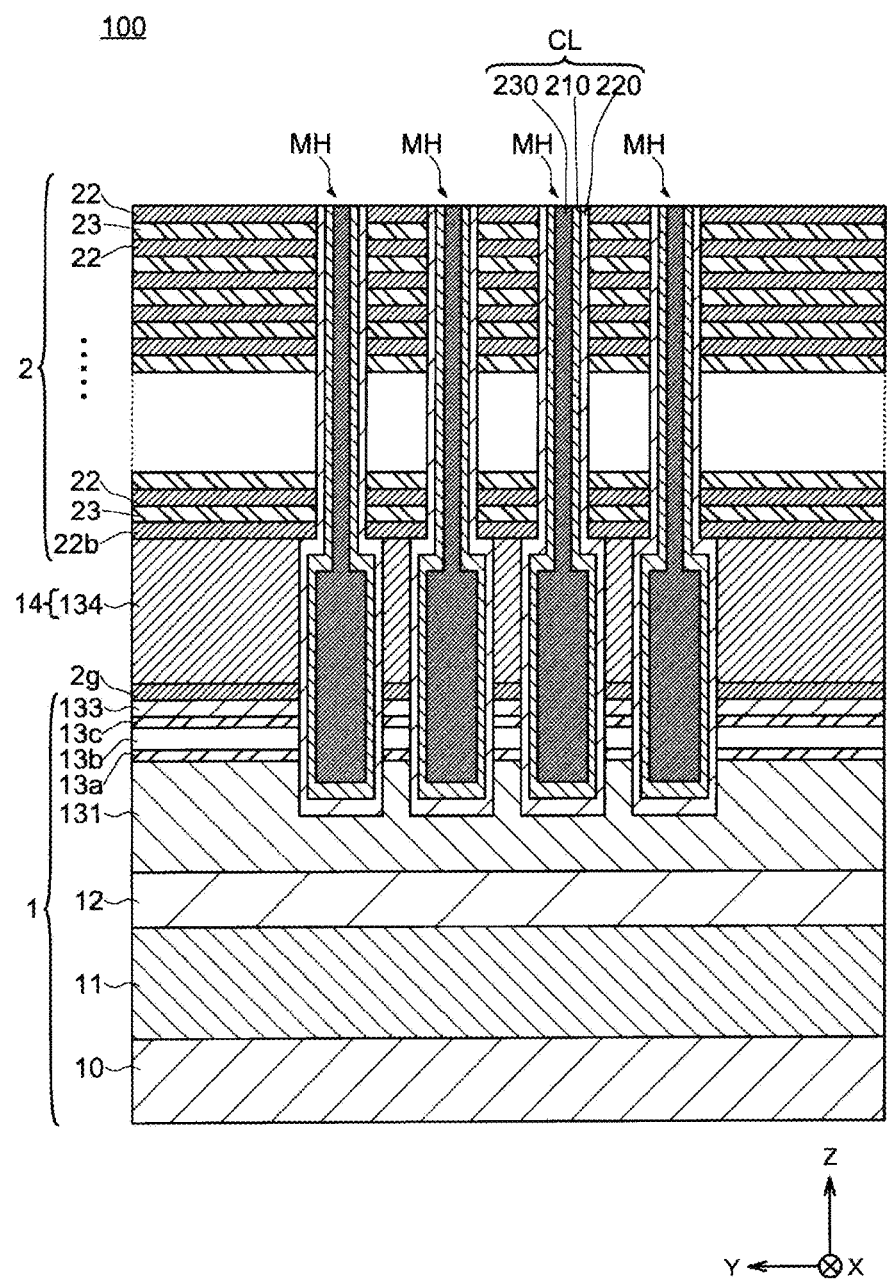
FIG. 20 is a diagram illustrating a method for manufacturing a semiconductor device according to an embodiment.

Subsequently, as illustrated in FIG. 20, the memory film 220 is formed in the memory hole MH. At this time, the cover insulating layer 221, the charge trapping layer 222, and the tunnel insulating layer 223 described with reference to FIGS. 2 to 5 are formed in the memory hole MH in this order. As the material forming the cover insulating layer 221, for example, silicon oxide is used. As the material for forming the charge trapping layer 222, for example, silicon nitride is used. As the material for forming the tunnel insulating layer 223, for example, an insulating material such as silicon oxide, silicon nitride, or silicon oxynitride is used. Next, the semiconductor body 210 is formed on the memory film 220. As the material for forming the semiconductor body 210, for example, a semiconductor material such as polysilicon is used. Next, the core layer 230 is formed on the semiconductor body 210. As the material for forming the core layer 230, for example, an insulating material such as silicon oxide is used. As described above, the memory film 220 (the cover insulating layer 221, the charge trapping layer 222, and the tunnel insulating layer 223), the semiconductor body 210, and the core layer 230 are formed on the inner wall of the memory hole MH in this order. The memory hole MH is buried by using the memory film 220, the semiconductor body 210, and the core layer 230.

Figure 21:
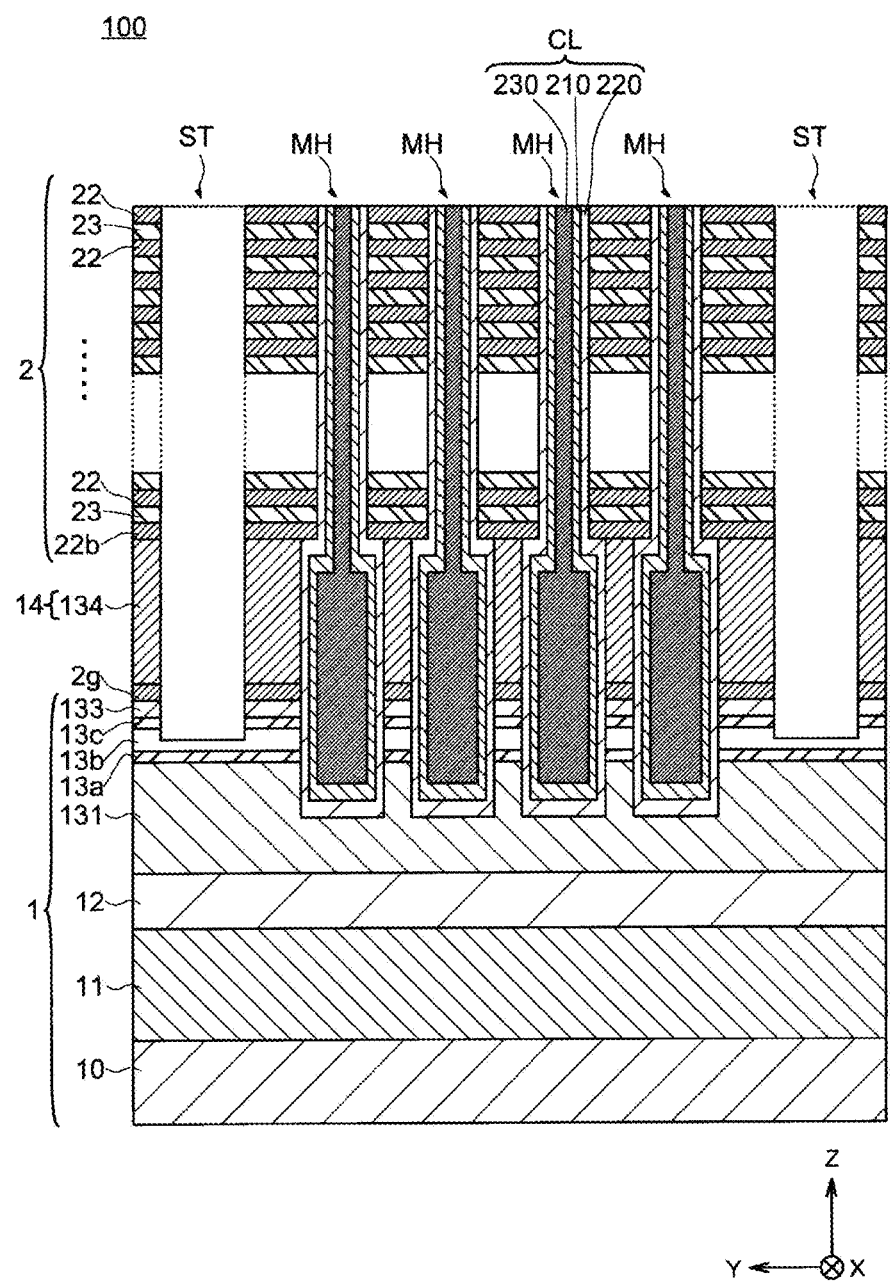
FIG. 21 is a diagram illustrating a method for manufacturing a semiconductor device according to an embodiment.

Next, as illustrated in FIG. 21, the stacked body 2 is anisotropically etched to form a slit ST. The slit ST extends in the stacked body 2 in the Z direction, penetrates the stacked body 2 from the upper end of the stacked body 2 to the middle of the sacrifice layer 13b, and is provided in common to the insulating layer 22 and the sacrifice layer 13b. The slit ST is an opening different from the memory hole MH and is formed as an opening extending in the X direction as well. The slit ST may be formed at any depth as long as it penetrates the stacked body 2. In the present embodiment, the memory hole MH is formed before (earlier than) the slit ST. In the present embodiment, for example, the slit ST is also referred to as a first opening, the memory hole MH is also referred to as a second opening, and the opening is also referred to as a groove.

Figure 22:
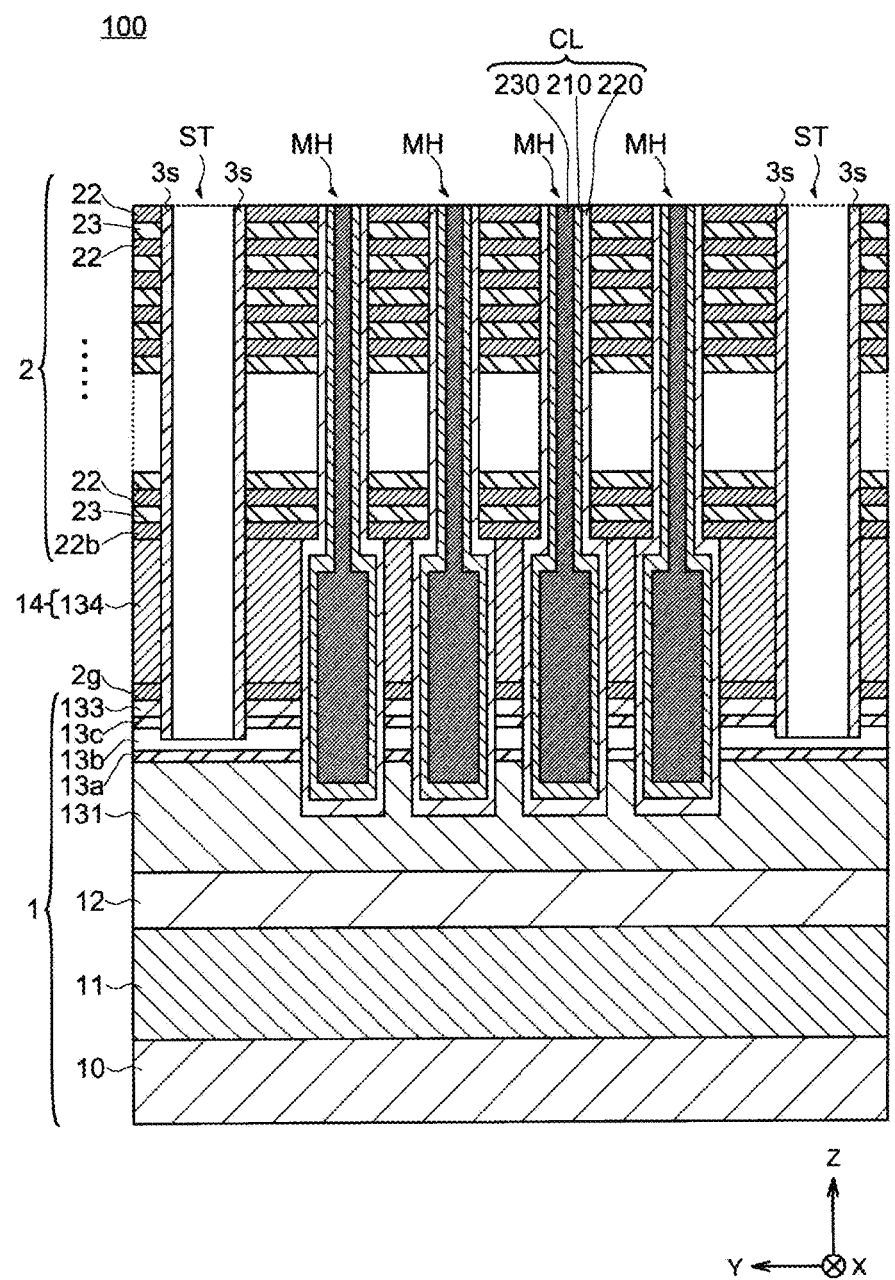
FIG. 22 is a diagram illustrating a method for manufacturing a semiconductor device according to an embodiment.

Subsequently, as illustrated in FIG. 22, the stopper layer 3s is formed on the side wall of the slit ST. As the material for forming the stopper layer 3s, for example, silicon nitride is used. In the present embodiment, for example, the stopper layer 3s is also referred to as an insulator.

Figure 23:
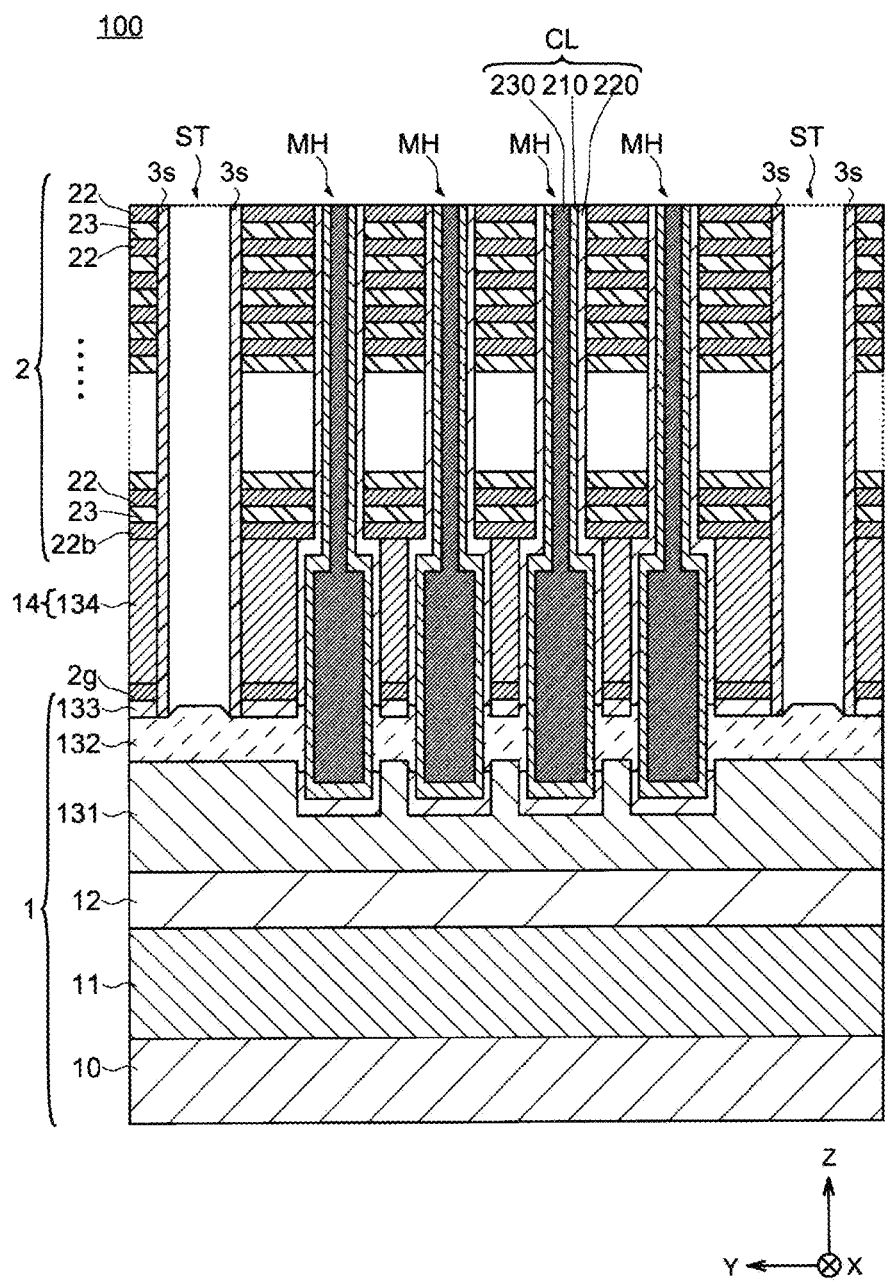
FIG. 23 is a diagram illustrating a method for manufacturing a semiconductor device according to an embodiment.

Subsequently, as illustrated in FIG. 23, the intermediate layer 13c, the sacrifice layer 13b, and the intermediate layer 13a are removed (etched) via the slit ST, and the semiconductor layer 132 is buried. At this time, since the stopper layer 3s covers the inner wall of the slit ST, the insulating layer 22 is not etched. As the material for forming the semiconductor layer 132, the same material as the material for forming the semiconductor layer 131 and the semiconductor layer 133 described above may be used. For example, as the material for forming the semiconductor layer 132, impurity-doped silicon or non-impurity-doped silicon is used.

Figure 24:
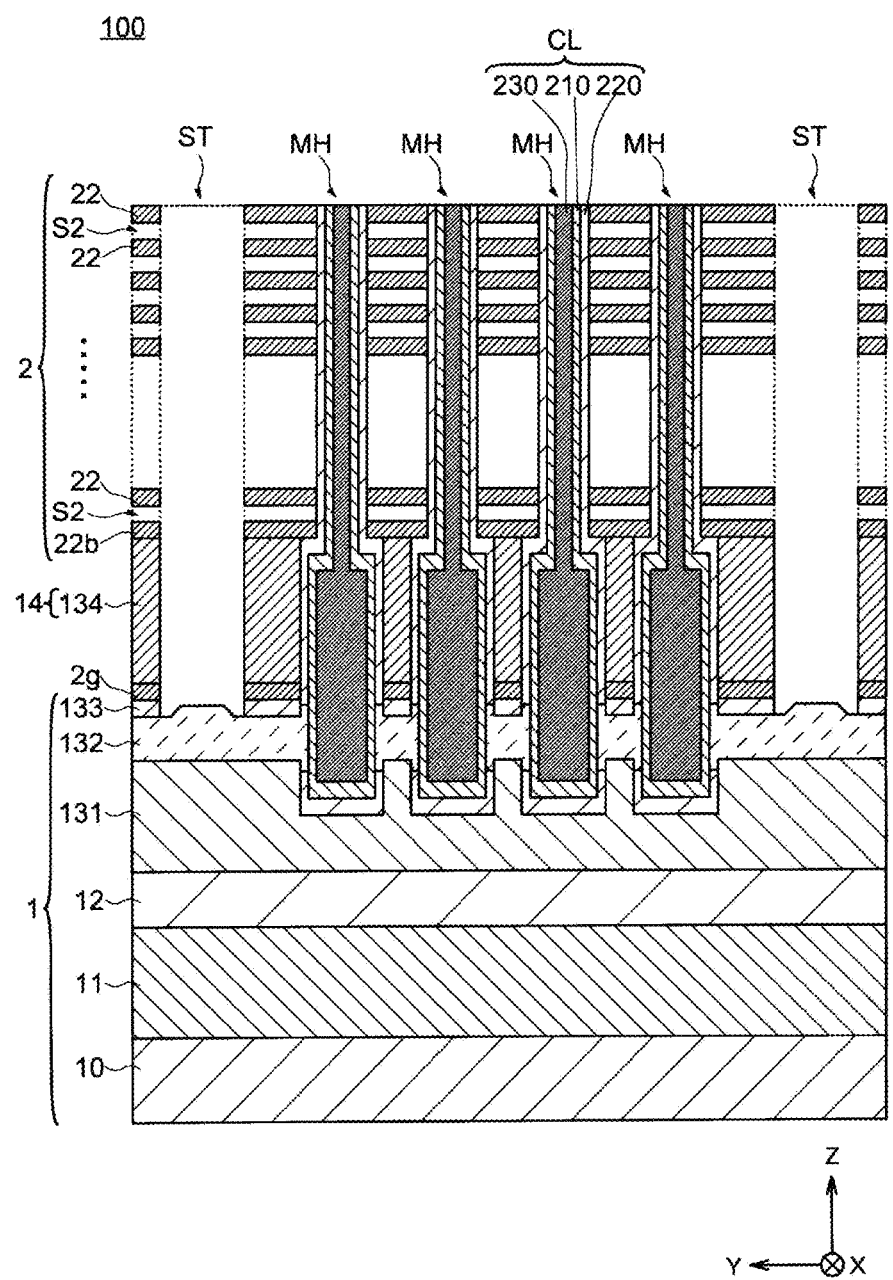
FIG. 24 is a diagram illustrating a method for manufacturing a semiconductor device according to an embodiment.

Subsequently, as illustrated in FIG. 24, the sacrifice layer 23 is isotropically etched together with the stopper layer 3s via the slit ST, by using a thermal phosphoric acid solution. The thermal phosphoric acid solution selectively etches a silicon nitride film against a silicon oxide film and silicon. Therefore, as illustrated in FIG. 24, the sacrifice layer 23 is selectively removed (etched) while the insulating layer 22 is left, to form the space S2 in the Y direction and the X direction. At this time, the etching of the sacrifice layer 23 proceeds from the slit ST toward the memory hole MH in the Y direction. Since the cover insulating layer 221 is formed of a silicon oxide film, the etching of the sacrifice layer 23 is stopped at the cover insulating layer 221. Therefore, the space S2 is provided between the plurality of insulating layers 22 adjacent to each other in the Z direction from the slit ST to the cover insulating layer 221 of the memory hole MH. Since the cover insulating layer 221 protects the charge trapping layer 222, the cover insulating layer 221 that is not in contact with the insulating layer 22 may be removed together with the sacrifice layer 23 to be etched, and a portion of the cover insulating layer 221 that is not in contact with the insulating layer 22 may be left unremoved together with the sacrifice layer 23.

Figure 25:
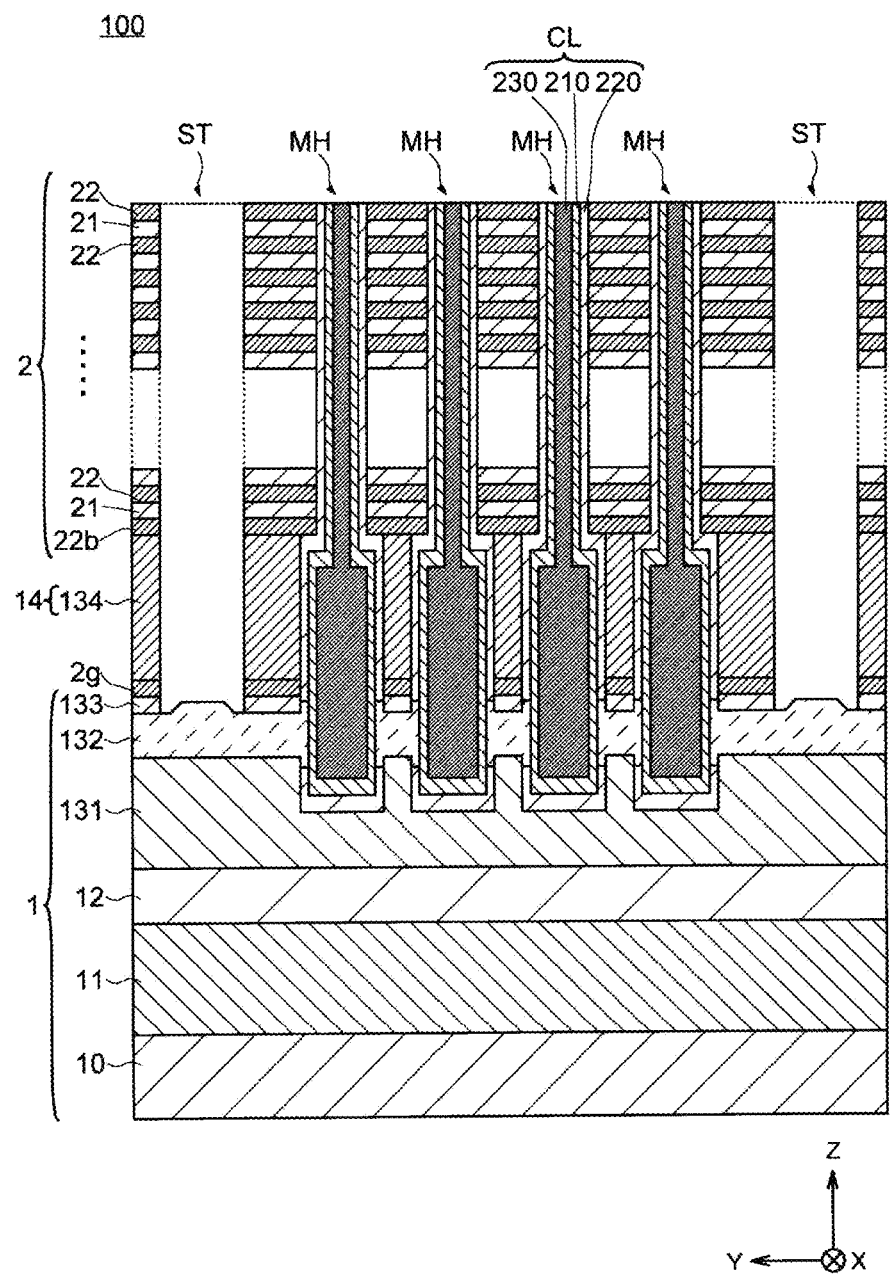
FIG. 25 is a diagram illustrating a method for manufacturing a semiconductor device according to an embodiment.

Next, as illustrated in FIG. 25, the conductive layer 21 is formed. Since the formation of the conductive layer 21 has been described in detail with reference to FIGS. 7 to 11, it will be briefly described here. As described with reference to FIGS. 7 to 11 and 12, aluminum oxide ($Al_2O_3$) is thinly formed as the block insulating layer 21a on the inner wall of the space S2 via the slit ST, by using a thermal CVD method, an ALD method, or the like. Next, for example, the first gas containing carbon (C) (a gas containing $CH_4$) is supplied via the slit ST to thinly form the protective layer 21b including a layer containing a bond between aluminum (Al) and carbon (C) on the block insulating layer 21a by using a thermal CVD method or the like. Next, a raw material gas containing molybdenum (Mo) (a gas containing $MoO_2Cl_2$) and a reducing gas (a hydrogen ($H_2$) gas) are alternately supplied via the slit ST to form the conductive layer 21 on the block insulating layer 21a, by using a thermal CVD method or the like. At this time, the conductive layer 21 is also formed on the side wall of the insulating layer 22 in the slit ST. Further, the slit ST extends in the stacked body 2 in the Z direction, penetrates the stacked body 2 from the upper end of the stacked body 2, and is provided in common to the insulating layer 22 and the conductive layer 21. The slit ST in the stacked body 2 is in contact with a portion of the insulating layer 22, a portion of the block insulating layer 21a (FIGS. 9 to 11), a portion of the protective layer 21b (FIGS. 9 to 11), and a portion of the conductive layer 21.

Next, the conductive layer 21 provided on the side wall of the insulating layer 22 in the slit ST is removed while leaving molybdenum filled in the space S2 between the insulating layers 22. For example, the conductive layer 21 provided on the side wall of the insulating layer 22 is etched by wet-etching via the slit ST, by using a mixed solution containing phosphoric acid. As a result, the conductive layers 21 provided inside the protective layers 21b in the plurality of spaces S2 arranged in the Z direction are electrically isolated from each other to form a plurality of conductive layers 21 (word lines WL).

Next, as illustrated in FIG. 2, the slit ST is filled with the insulating layer 3. As the material for forming the insulating layer 3, for example, an insulating material such as a silicon oxide film is used. After that, as illustrated in FIG. 1, the contact Cb (FIG. 1), the bit line BL (FIG. 1), the wirings, and the like are formed. As described above, the semiconductor device 100 (FIG. 1) according to the present embodiment is formed.

When the present embodiment is applied to a semiconductor device other than the nonvolatile memory, for example, a conductive layer (e.g., molybdenum) is formed between a plurality of adjacent insulating layers in each of the X direction, the Y direction, and the Z direction. This conductive layer may be used, for example, as a wiring.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device comprising:
a stacked body including:
an insulating layer;
a conductive layer containing molybdenum;
an aluminum oxide layer provided between the insulating layer and the conductive layer; and
a protective layer in contact with the aluminum oxide layer, containing sulfur bonded to aluminum in the aluminum oxide layer, and also in contact with the conductive layer;
wherein the aluminum oxide layer is configured to prevent tunneling charges from the conductive layer.

2. The semiconductor device according to claim 1, wherein the stacked body further includes an insulator provided adjacent the insulating layer and the conductive layer, and in contact with a portion of the insulating layer, a portion of the aluminum oxide layer, a portion of the protective layer, and a portion of the conductive layer.

3. The semiconductor device according to claim 2, wherein the stacked body further includes:
a semiconductor layer provided adjacent the insulating layer and the conductive layer, and extending in a stacking direction of the stacked body;
a tunnel insulating layer provided between the conductive layer and the semiconductor layer;
a charge trapping layer provided between the tunnel insulating layer and the conductive layer; and
a cover insulating layer provided between the charge trapping layer and the conductive layer.

4. The semiconductor device according to claim 3, wherein a memory cell includes respective portions of the conductive layer, the semiconductor layer, the tunnel insulating layer, the charge trapping layer, the cover insulating layer, the insulating layer, and the aluminum oxide layer, and
the memory cell corresponds to the conductive layer among a plurality of conductive layers alternately stacked with a plurality of insulating layers.

5. The semiconductor device according to claim 4, wherein the memory cell includes a control gate that controls writing or erasing for the memory cell, and the plurality of conductive layers are connected to a plurality of control gates, respectively.

6. The semiconductor device according to claim 1, wherein the conductive layer contains impurities of chlorine.

7. The semiconductor device according to claim 2, wherein the aluminum oxide layer wraps around a top surface, a bottom surface, and a first sidewall of the conductive layer, with a second sidewall of the conductive layer in contact with the insulator.

8. The semiconductor device according to claim 2, wherein the protective layer wraps around a top surface, a bottom surface, and a first sidewall of the conductive layer, with a second sidewall of the conductive layer in contact with the insulator.

* * * * *

UNITED STATES PATENT AND TRADEMARK OFFICE
CERTIFICATE OF CORRECTION

PATENT NO. : 12,310,017 B2
APPLICATION NO. : 17/466200
DATED : May 20, 2025
INVENTOR(S) : Kitamura et al.

Page 1 of 1

It is certified that error appears in the above-identified patent and that said Letters Patent is hereby corrected as shown below:

On the Title Page

Item (72) Inventors, the fourth inventor's name information should be listed as follows:
Hiroshi Toyoda, Yokkaichi Mie (JP)

Signed and Sealed this
Twenty-sixth Day of August, 2025

Coke Morgan Stewart
*Acting Director of the United States Patent and Trademark Office*